(12) United States Patent
Sliwa et al.

(10) Patent No.: US 10,693,566 B2
(45) Date of Patent: Jun. 23, 2020

(54) WIRELESS JOSEPHSON PARAMETRIC CONVERTER

(71) Applicant: Yale University, New Haven, CT (US)

(72) Inventors: Katrina Sliwa, New Haven, CT (US); Michael Hatridge, New Haven, CT (US); Anirudh Narla, New Haven, CT (US); Shyam Shankar, New Haven, CT (US); Luigi Frunzio, North Haven, CT (US); Robert J. Schoelkopf, III, Madison, CT (US); Michel Devoret, New Haven, CT (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 15/567,198

(22) PCT Filed: Apr. 15, 2016

(86) PCT No.: PCT/US2016/027817
§ 371 (c)(1),
(2) Date: Oct. 17, 2017

(87) PCT Pub. No.: WO2016/168642
PCT Pub. Date: Oct. 20, 2016

(65) Prior Publication Data
US 2018/0138987 A1    May 17, 2018

Related U.S. Application Data

(60) Provisional application No. 62/149,419, filed on Apr. 17, 2015.

(51) Int. Cl.
*H04B 10/90* (2013.01)
*G06N 99/00* (2019.01)
(Continued)

(52) U.S. Cl.
CPC ............ *H04B 10/90* (2013.01); *G06N 10/00* (2019.01); *H01L 27/18* (2013.01); *H01L 39/025* (2013.01);
(Continued)

(58) Field of Classification Search
None
See application file for complete search history.

(56) References Cited

U.S. PATENT DOCUMENTS

| | | | |
|---|---|---|---|
| 3,275,943 A | 9/1966 | Robert | |
| 3,663,886 A | 5/1972 | Blume | |

(Continued)

FOREIGN PATENT DOCUMENTS

| | | |
|---|---|---|
| CA | 2 470 845 A1 | 6/2003 |
| EP | 0 513 856 A2 | 11/1992 |

(Continued)

OTHER PUBLICATIONS

Abdo, B., Kamal, A. and Devoret, M., 2013. Nondegenerate three-wave mixing with the Josephson ring modulator. Physical Review B, 87(1), p. 014508.*

(Continued)

*Primary Examiner* — Zhitong Chen
(74) *Attorney, Agent, or Firm* — Wolf, Greenfield & Sacks, P.C.

(57) ABSTRACT

A wireless Josephson-junction-based parametric converter is described. The converter may be formed on a substrate with antennas that pump are configured to wirelessly receive pump, signal and idler frequencies and couple the received frequencies to the converter's circuitry. Capacitors may also be fabricated on the same substrate and sized to tune operation of the converter to desired frequencies. The converter may be coupled directly to microwave waveguides, (Continued)

and may be tuned to different signal frequencies by applying magnetic flux to the converter circuitry.

28 Claims, 11 Drawing Sheets

(51) Int. Cl.

| | | |
|---|---|---|
| H04B 10/70 | (2013.01) | |
| H01L 27/18 | (2006.01) | |
| H03D 7/00 | (2006.01) | |
| H01L 39/02 | (2006.01) | |
| H01L 39/04 | (2006.01) | |
| H01L 39/22 | (2006.01) | |
| H01P 3/12 | (2006.01) | |
| H03F 19/00 | (2006.01) | |
| H03D 9/06 | (2006.01) | |
| H01P 5/08 | (2006.01) | |
| G06N 10/00 | (2019.01) | |
| H01P 5/02 | (2006.01) | |
| H01P 5/103 | (2006.01) | |

(52) U.S. Cl.
CPC .......... *H01L 39/045* (2013.01); *H01L 39/223* (2013.01); *H01P 3/12* (2013.01); *H03D 7/005* (2013.01); *H03F 19/00* (2013.01); *H04B 10/70* (2013.01); *H01P 5/024* (2013.01); *H01P 5/08* (2013.01); *H01P 5/103* (2013.01); *H03D 2009/0691* (2013.01)

(56) References Cited

U.S. PATENT DOCUMENTS

| | | | |
|---|---|---|---|
| 4,344,052 A | 8/1982 | Davidson | |
| 4,403,189 A | 9/1983 | Simmonds | |
| 4,585,999 A | 4/1986 | Hilbert et al. | |
| 4,956,312 A | 9/1990 | Van Laarhoven | |
| 5,105,166 A | 4/1992 | Tsukii et al. | |
| 5,254,950 A | 10/1993 | Fan et al. | |
| 5,326,986 A | 7/1994 | Miller, Jr. et al. | |
| 5,493,719 A | 2/1996 | Smith et al. | |
| 5,582,877 A | 12/1996 | Nagamachi et al. | |
| 5,635,834 A | 6/1997 | Sloggett et al. | |
| 5,661,494 A * | 8/1997 | Bondyopadhyay | H01Q 1/364 343/700 MS |
| 5,920,811 A | 7/1999 | Suzuki et al. | |
| 6,549,059 B1 | 4/2003 | Johnson | |
| 6,578,018 B1 | 6/2003 | Ulyanov | |
| 6,621,374 B2 | 9/2003 | Higgins et al. | |
| 6,627,915 B1 | 9/2003 | Ustinov et al. | |
| 6,635,898 B2 | 10/2003 | Williams et al. | |
| 6,822,255 B2 | 11/2004 | Tzalenchuk et al. | |
| 6,838,694 B2 | 1/2005 | Esteve et al. | |
| 6,900,454 B2 | 5/2005 | Blais et al. | |
| 6,911,664 B2 | 6/2005 | Il'ichev et al. | |
| 6,943,368 B2 | 9/2005 | Amin et al. | |
| 7,042,005 B2 | 5/2006 | Il'ichev et al. | |
| 7,129,869 B2 | 10/2006 | Furuta et al. | |
| 7,253,654 B2 | 8/2007 | Amin | |
| 7,307,275 B2 | 12/2007 | Lidar et al. | |
| 7,364,923 B2 | 4/2008 | Lidar et al. | |
| 7,369,093 B2 | 5/2008 | Oppenländer et al. | |
| 7,443,720 B2 | 10/2008 | Astafiev et al. | |
| 7,498,832 B2 | 3/2009 | Baumgardner et al. | |
| 7,533,068 B2 | 5/2009 | Maassen van den Brink et al. | |
| 7,724,083 B2 | 5/2010 | Herring et al. | |
| 7,800,395 B2 | 9/2010 | Johnson et al. | |
| 7,876,248 B2 | 1/2011 | Berkley et al. | |
| 7,899,092 B2 | 3/2011 | Malinovsky | |
| 7,932,515 B2 | 4/2011 | Bunyk | |
| 8,032,474 B2 | 10/2011 | Macready et al. | |
| 8,106,717 B2 | 1/2012 | Ichimura et al. | |
| 8,111,083 B1 | 2/2012 | Pesetski et al. | |
| 8,138,784 B2 | 3/2012 | Przybysz et al. | |
| 8,179,133 B1 | 5/2012 | Kornev et al. | |
| 8,234,103 B2 | 7/2012 | Biamonte et al. | |
| 8,416,109 B2 | 4/2013 | Kirichenko | |
| 8,508,280 B2 | 8/2013 | Naaman et al. | |
| 8,514,478 B1 | 8/2013 | Spence | |
| 8,922,239 B2 | 12/2014 | Pesetski et al. | |
| 9,467,126 B1 | 10/2016 | Naaman et al. | |
| 9,892,365 B2 | 2/2018 | Rigetti et al. | |
| 9,948,254 B2 | 4/2018 | Narla et al. | |
| 2001/0025012 A1 * | 9/2001 | Tarutani | H01L 27/18 505/100 |
| 2002/0188578 A1 | 12/2002 | Amin et al. | |
| 2003/0136973 A1 | 7/2003 | Ogawa et al. | |
| 2003/0193097 A1 | 10/2003 | Il'ichev et al. | |
| 2004/0059760 A1 | 3/2004 | Ageishi et al. | |
| 2004/0077503 A1 | 4/2004 | Blais et al. | |
| 2004/0140537 A1 | 7/2004 | Il'ichev et al. | |
| 2005/0001209 A1 | 1/2005 | Hilton et al. | |
| 2005/0117836 A1 | 6/2005 | Franson et al. | |
| 2005/0134377 A1 | 6/2005 | Dent | |
| 2005/0224784 A1 | 10/2005 | Amin et al. | |
| 2006/0097747 A1 | 5/2006 | Amin | |
| 2006/0179029 A1 | 8/2006 | Vala et al. | |
| 2007/0215862 A1 | 9/2007 | Beausoleil et al. | |
| 2007/0296953 A1 | 12/2007 | Allen et al. | |
| 2008/0100175 A1 | 5/2008 | Clark | |
| 2008/0274898 A1 | 11/2008 | Johnson et al. | |
| 2008/0297230 A1 | 12/2008 | Dzurak et al. | |
| 2009/0028340 A1 | 1/2009 | Trifonov | |
| 2009/0033369 A1 | 2/2009 | Baumgardner et al. | |
| 2009/0074355 A1 | 3/2009 | Beausoleil et al. | |
| 2009/0153180 A1 | 6/2009 | Herr | |
| 2009/0232191 A1 | 9/2009 | Gupta et al. | |
| 2009/0258787 A1 | 10/2009 | Wilkie et al. | |
| 2009/0289638 A1 | 11/2009 | Farinelli et al. | |
| 2010/0241780 A1 | 9/2010 | Friesen | |
| 2010/0246152 A1 | 9/2010 | Lin et al. | |
| 2011/0060710 A1 | 3/2011 | Amin | |
| 2011/0079889 A1 | 4/2011 | Baillin | |
| 2012/0074509 A1 | 3/2012 | Berg et al. | |
| 2012/0319085 A1 | 12/2012 | Gambetta et al. | |
| 2012/0319684 A1 | 12/2012 | Gambetta et al. | |
| 2012/0326130 A1 | 12/2012 | Maekawa et al. | |
| 2012/0326720 A1 | 12/2012 | Gambetta et al. | |
| 2013/0029848 A1 | 1/2013 | Gonzalez et al. | |
| 2013/0043945 A1 | 2/2013 | McDermott et al. | |
| 2013/0107352 A1 | 5/2013 | Santori et al. | |
| 2013/0196855 A1 | 8/2013 | Poletto et al. | |
| 2013/0271265 A1 | 10/2013 | Finn | |
| 2014/0167836 A1 | 6/2014 | Gambetta et al. | |
| 2014/0314419 A1 * | 10/2014 | Paik | H04B 10/70 398/115 |
| 2015/0241481 A1 | 8/2015 | Narla et al. | |
| 2016/0308502 A1 | 10/2016 | Abdo et al. | |
| 2017/0039481 A1 | 2/2017 | Abdo | |
| 2018/0040935 A1 | 2/2018 | Sliwa et al. | |
| 2018/0054165 A1 | 2/2018 | Szocs et al. | |
| 2018/0198427 A1 | 7/2018 | Narla et al. | |
| 2019/0020346 A1 | 1/2019 | Wang et al. | |
| 2019/0190474 A1 | 6/2019 | Abdo et al. | |

FOREIGN PATENT DOCUMENTS

| | | |
|---|---|---|
| EP | 2 249 173 A1 | 11/2010 |
| EP | 2 264 799 A1 | 12/2010 |
| EP | 17739044.0 | 7/2019 |
| GB | 1 370 647 A | 10/1974 |
| JP | S61-067304 A | 4/1986 |
| JP | H06-265612 A | 9/1994 |
| JP | 2-924421 B2 | 7/1999 |
| JP | H11-266153 A | 9/1999 |
| JP | 2001-345488 | 12/2001 |
| JP | 2004-080129 | 3/2004 |
| JP | 2006-344761 A | 12/2006 |
| RU | 2 106 717 C1 | 3/1998 |
| RU | 2 212 671 C1 | 9/2003 |

(56) References Cited

FOREIGN PATENT DOCUMENTS

| RU | 2010 124 198 A | 12/2011 |
| WO | WO 2017/065856 A1 | 4/2017 |

OTHER PUBLICATIONS

Schackert, F., "A Practical Quantum-Limited Parametric Amplifier Based on the Josephson Ring Modulator", A Dissertation Presented to the Faculty of the Graduate School of Yale University in Candidacy for the Degree of Doctor of Philosophy, Dec. 2013.*
Roch, N., Flurin, E., Nguyen, F., Morfin, P., Cannpagne-Ibarcq, P., Devoret, M.H. and Huard, B., 2012. Widely tunable, nondegenerate three-wave mixing microwave device operating near the quantum limit. Physical review letters, 108(14), p. 147701.*
Partial Supplementary European Search Report for Application No. EP 14854592.4 dated Mar. 29, 2017.
Extended European Search Report for European Application No. EP 14854592.4 dated Aug. 10, 2017.
International Search Report and Written Opinion for International Application No. PCT/US2014/060694 dated Apr. 2, 2015.
International Preliminary Report on Patentability for International Application No. PCT/US2014/060694 dated Apr. 28, 2016.
Extended European Search Report for European Application No. EP 16756465.7 dated Sep. 28, 2018.
International Search Report and Written Opinion for International Application No. PCT/U52016/019821 dated May 6, 2016.
International Preliminary Report on Patentability for International Application No. PCT/US2016/019821 dated Sep. 8, 2017.
Extended European Search Report for European Application No. EP 16756463.2 dated Sep. 7, 2018.
International Search Report and Written Opinion for International Application No. PCT/US2016/019819 dated May 3, 2016.
International Preliminary Report on Patentability for International Application No. PCT/US2016/019819 dated Sep. 8, 2017.
Extended European Search Report for European Application No. 16780864.1, dated Mar. 5, 2019.
Invitation to Pay Additional Fees for International Application No. PCT/US2016/027817 dated Jun. 3, 2016.
International Search Report and Written Opinion for International Application No. PCT/US2016/027817 dated Aug. 22, 2016.
International Preliminary Report on Patentability for International Application No. PCT/US2016/027817 dated Oct. 26, 2017.
International Search Report and Written Opinion for International Application No. PCT/US2017/013426 dated Apr. 5, 2017.
International Preliminary Report on Patentability for International Application No. PCT/US2017/013426 dated Jul. 26, 2018.
International Search Report and Written Opinion for International Application No. PCT/US2018/064922, dated Mar. 8, 2019.
Abdo et al., Full coherent frequency conversion between two propagating microwave modes. Phys Rev Lett. Apr. 26, 2013;110:173902.1-5. doi: 10.1103/PhysRevLett.110.173902.
Abdo et al., Josephson amplifier for qubit readout. Appl Phys Lett. 2011; 99(16): 162506. doi: 10.1063/1.3653473.
Abdo et al., Josephson directional amplifier for quantum measurement of superconducting circuits. Phys Rev Lett. Apr. 25, 2014;112:167701.1-5. doi: 10.1103/PhysRevLett.112.167701.
Albert et al., Holonomic quantum computing with cat-codes. Apr. 10, 2015. arXiv:1503.00194v2. 5 pages.
Albert et al., Symmetries and conserved quantities in Lindblad master equations. Phys Rev A. Feb. 2014;89(2):022118. arXiv:1310. 1523v2. 15 pages.
Araujo et al., a LEKID-based CMB instrument design for large-scale observations in Greenland. Proc of SPIE—The International Society for Optical Engineering. Aug. 4, 2014 4;9153:91530W. doi: 10.1117/12.2056828.
Barends et al., Minimizing quasiparticle generation from stray infrared light in superconducting quantum circuits, Appl Phys Lett. Sep. 13, 2011;99(11):113507.

Bergeal et al., Analog information processing at the quantum limit with a Josephson ring modulator. Nat Phys. Apr. 2010;6(4):296-302. doi: 10.1038/NPHYS1516. Epub Feb. 14, 2010. 7 pages.
Bergeal et al., Phase-preserving amplification near the quantum limit with a Josephson ring modulator. Nature. May 2010;465(7294):64-8. arXiv:0912.3407v1. 20 pages.
Bergeal et al., Phase-preserving amplification near the quantum limit with a Josephson ring modulator. Nature. 2010;465:64-9.
Bockstiegel et al., Development of broadband NbTiN traveling wave parametric amplifier for MKID readout. J Low Temp Phys. 2014;176:476-82.
Burgarth et al., Non-Abelian phases from quantum Zeno dynamics. Phys Rev A. Oct. 9, 2013;88:042107.1-5. doi: 10.1103/PhysRevA. 88.042107.
Campagne-Ibarcq et al., Observing quantum state diffusion by heterodyne detection of fluorescence. Phys Rev X. 2016;6:011002.
Campagne-Ibarcq et al., Persistent control of a superconducting qubit by stroboscopic measurement feedback. Phys Rev X. 2013;3:1-7. arXiv:1301.6095v2.
Carollo et al., Coherent Quantum Evolution via Reservoir Driven Holonomy. Phys Rev Lett. Jan. 18, 2006;96;020403. arXiv:quant-ph/0507229v2. 4 pages.
Carollo et al., Geometric Phase Induced by a Cyclically Evolving Squeezed Vacuum Reservoir. Phys Rev Lett. Apr. 21, 2006;96:150403. arXiv:quant-ph/0507101v2. 5 pages.
Castellanos-Beltran et al., Amplification and squeezing of quantum noise with a tunable Josephson metamaterial. Nat Phys. Dec. 2008;4(12):928-31.
Castellanos-Beltran et al., Widely tunable parametric amplifier based on a superconducting quantum interference device array resonator. Applied Physics Letters. 2007;91(8). 4 pages.
Catelani et al., Relaxation and frequency shifts induced by quasiparticles in superconducting qubits, Phys Rev B. 2011;84(6) 064517.
Caves, Quantum limits on noise in linear amplifiers. Phys. Rev. D. 1982;26(8):1817-39.
Chaturvedi et al., Berry's phase for coherent states. J Phys A: Math Gen. 1987;20(16):L10715.
Corcoles et al., Protecting superconducting qubits from radiation. App Phys Lett. 2011;99(18):181906.
Court et al., Quantitative study of quasiparticle traps using the single-Cooper-pair transistor. Phys Rev B. 2008;77(10):100501.
Dasgupta et al., Decoherence-induced geometric phase in a multi-level atomic system. J Phys B: At Mol Opt Phys. 2007 Apr 18;40(9):S127. arXiv:quant-ph/0612201v1. 10 pages.
De Lange et al., Reversing quantum trajectories with analog feedback. Phys Rev Lett. 2014;112:080501.
De Ponte et al., Relaxation—and decoherence-free subspaces in networks of weakly and strongly coupled resonators. Ann Phys. Mar. 12, 2007;322:2077-84.
Devoret et al., Superconducting Circuits for Quantum Information: An Outlook. Science. Mar. 8, 2013;339:1169-74. doi: 10.1126/science.1231930.
Dolan, Offset masks for lift-off photoprocessing. App Phys Lett. 1977;31(5):337-9.
Duan et al., Preserving Coherence in Quantum Computation by Pairing Quantum Bits. Phys Rev Lett. Sep. 8, 1997;79(10-8):1953-6.
Eichler et al., Controlling the dynamic range of a Josephson parametric amplifier. EPJ Quantum Tech. Jan. 29, 2014;1(2). doi:10. 1140/epjqt2. 19 pages.
Facchi et al., Quantum Zeno Subspaces. Phys Rev Lett. Aug. 19, 2002;89(8):080401.1-4.
Flurin et al., Superconducting quantum node for entanglement and storage of microwave radiation. Phys Rev Lett. Mar. 6, 2015;114(9) :090503. Epub Mar. 4, 2015.
Flurin et al., Generating entangled microwave radiation over two transmission lines. Phys Rev Lett. Nov. 2, 2012;109(18):183901. Epub Oct. 31, 2012.
Frattini et al., 3-wave mixing Josephson dipole element. App Phys Lett. 2017;110:222603-4.
Friedrich et al., Experimental quasiparticle dynamics in a superconducting, imaging x-ray spectrometer, App Phys Lett. 1997;71(26):3901.

(56) References Cited

OTHER PUBLICATIONS

Golubov et al., Quasiparticle lifetimes and tunneling times in a superconductor-insulator-superconductor tunnel junction with spatially inhomogeneous electrodes. Phys Rev B Condens Matter. May 1, 1994;49(18):12953-68.
Gueron, Quasiparticles in a diffusive conductor: interaction and pairing, Universite Pierre et Marie Curie—Paris Vi. 1997, 241 pages.
Hatridge et al., Dispersive magnetometry with a quantum limited SQUID parametric amplifier. Phys Rev B. Apr. 2011;83(13):134501-1-8.
Hatridge et al., Quantum back-action of an individual variable-strength measurement. Science. Jan. 11, 2013; 339(6116): 178-81. doi: 10.1126/science.1226897.
Heeres et al., Cavity State Manipulation Using Photon-Number Selective Phase Gates. Phys Rev Lett. Sep. 25, 2015;115:137002. 1-5. doi: 10.1103/PhysRevLett.115.137002.
Ho Eom et al., a wideband, low-noise superconducting amplifier with high dynamic range. Nature Physics. 2012;8(8):623-7.
Hofheinz et al., Synthesizing arbitrary quantum states in a superconducting resonator. Nature. May 28, 2009;459:546-9. doi:10.1038/nature08005. Supplementary Information. 6 pages.
Houck et al., Life after charge noise: recent results with transmon qubits. Quantum Info Process. Feb. 11, 2009;8(2-3):105-15.
Hover et al., High fidelity qubit readout with the superconducting lowinductance undulatory galvanometer microwave amplifier. Appl Phys Lett. 2014;104;152601.1-4.
Hover et al., Superconducting Low-inductance Undulatory Galvanometer Microwave Amplifier. Appl Phys Lett. Feb. 7, 2012;100:063503.1-3.
Johnson et al., Dispersive readout of a flux qubit at the single photon level. Phys Rev B. 2011;84:220503. arXiv:1109.2858v2. 5 pages.
Kamal et al., Gain, directionality, and noise in microwave SQUID amplifiers: Input-output approach. Phys Rev B. 2012;86:144510.1-12. doi: 10.1103/PhysRevB.86.144510.
Kamal et al., Noiseless nonreciprocity in a parametric active device. Nature Physics. 2011;7:311-315.
Kamal et al., Signal-to-pump back action and self-oscillation in double-pump Josephson parametric amplifier. Phys. Rev. B. May 13, 2009;79:184301.
Kerckhoff et al., On-chip superconducting microwave circulator from synthetic rotation. Phys Rev Appl. 2015;4:034002. arXiv:1502.06041. Submitted Feb. 21, 2015. 13 pages.
Kirchmair et al., Observation of quantum state collapse and revival due to the single-photon Kerr effect. Nature. Mar. 14, 2013;495:205-9. doi:10.1038/nature11902.
Knill et al., Theory of Quantum Error Correction for General Noise. Phys Rev Lett. Mar. 13, 2000;84(11):2525-8. arXiv:quant-ph/9908066v1. 6 pages.
Koch et al., Time-reversal symmetry breaking in circuit-QED based photon lattices. arXiv:1006.0762v2. Oct. 11, 2010. 19 pages.
Krastanov et al., Universal Control of an Oscillator with Dispersive Coupling to a Qubit. Phys Rev A. 2015;92:040303. arXiv:1502.08015. Submitted Feb. 27, 2015. 5 pages.
Lähteenmäki et al., Advanced Concepts in Josephson Junction Reflection Amplifiers. Journal of Low Temperature Physics. 2014;175(5-6):868-76.
Leghtas et al., Confining the state of light to a quantum manifold by engineered two-photon loss. Dec. 16, 2014. arXiv:1412.4633v1. 29 pages.
Lidar et al., Decoherence Free Subspaces for Quantum Computation. Phys Rev Lett. Sep. 21, 1998;81(12):2594-7. arXiv:quant-ph/9807004v2. 4 pages.
Lindblad, on the generators of quantum dynamical semigroups. Commun Math Phys. 1976;48(2):119-30.
Liu et al., Comparing and combining measurement-based and driven-dissipative entanglement stabilization. Phys. Rev. X. 2016;6:011022.
Macleod et al., Periodicity in Al/Ti superconducting single electron transistors. App Phys Lett. Aug. 3, 2009;95:052503.
Martinis et al., Calculation of Tc in a normal-superconductor bilayer using the microscopic-based Usadel theory. Nucl Instrum Methods Phys Res A. 2000;444(1)2:23-27.
Martinis et al., Energy decay in superconducting Josephson-Junction qubits from nonequilibrium quasiparticle excitations. Phys Rev Lett. 2009;103(9):097002.
Metelmann et al., Nonreciprocal photon transmission and amplification via reservoir engineering. Phys. Rev. X. 2015(5):021025.
Minev et al., Planar Superconducting Whispering Gallery Mode Resonators. Appl Phys Lett. Oct. 3, 2013;103:142604.1-3. doi: 10.1063/1.4824201.
Mirrahimi et al., Dynamically protected cat-qubits: a new paradigm for universal quantum computation. New J Phys. Apr. 22, 2014;16:045014. 31 pages.
Mousolou et al., Universal non-adiabatic holonomic gates in quantum dots and single-molecule magnets. New J Phys. Jan. 17, 2014;16:013029. 10 pages.
Mück et al., Superconducting Quantum Interference Device as a Near-Quantum-Limited Amplifier at 0.5 GHz. Appl Phys Lett. Feb. 12, 2001;78(7):967-9. doi: 10.1063/1.1347384.
Murch et al., Observing single quantum trajectories of a superconducting quantum bit. Nature. Oct. 10, 2013;502(7470):211-4. doi: 10.1038/nature12539.
Mutus et al., Design and characterization of a lumped element single-ended superconducting microwave parametric amplifier with on-chip flux bias line. App Phys Lett. Sep. 17, 2013;103:122602.
Narla et al., Robust concurrent remote entanglement between two superconducting qubits. Phys Rev X. 2016;6:031036.
Narla et al., Wireless Josephson amplifier. Appl Phys Lett. 2014;104:232605. doi: 10.1063/1.4883373. 6 pages.
Nsanzineza et al., Trapping a single vortex and reducing quasiparticles in a superconducting resonator. Phys Rev Lett. Sep. 12, 2014;113(11): 117002. Epub Sep. 12, 2014.
O'Brien et al., Resonant Phase Matching of Josephson Junction Traveling Wave Parametric Amplifiers. Phys Rev Lett. Oct. 10, 2014;113:157001.1-5.
Ofek et al., Demonstrating quantum error correction that extends the lifetime of quantum information. Nature. 2016;536:441-445.
Oreshkov et al., Adiabatic Markovian Dynamics. Phys Rev Lett. Jul. 30, 2010;105(5):050503. arXiv:1002.2219v4. 7 pages.
Oreshkov et al., Fault-Tolerant Holonomic Quantum Computation. Phys Rev Lett. Feb. 20, 2009;102:070502.1-4.
Oreshkov, Holonomic Quantum Computation in Subsystems. Phys Rev Lett. Aug. 28, 2009;103(9):090502. arXiv:0905.1249v3. 5 pages.
Pachos et al., Decoherence-free dynamical and geometrical entangling phase gates. Phys Rev A. 2004;69:033817. arXiv:quant-ph/0309180v3. 10 pages.
Paik et al., Observation of High Coherence in Josephson Junction Qubits Measured in a Three-Dimensional Circuit QED Architecture. Phys Rev Lett. Dec. 5, 2011;107(24):240501. arXiv:1105.4652v4. 5 pages.
Paz-Silva et al., Zeno Effect for Quantum Computation and Control. Phys Rev Lett. Feb. 24, 2011;108(8):080501. arXiv:1104.5507v2. 7 pages.
Peltonen et al., Magnetic-field-induced stabilization of nonequilibrium superconductivity in a normal- metal/insulator/superconductor junction. Phys Rev B. 2011;84(22):220502.
Pillet et al., Optimal design for the Josephson mixer. Mar. 30, 2015. arXiv:1503.08185v1. 5 pages.
Pillet, Amplification, entanglement and storage of microwave radiation using superconducting circuits. University of Virginia. Seminar. 2014;1-78.
Platenberg, Coupled superconducting flux qubits. Delft University of Technology. Thesis. 2007. 153 pages.
Pop et al., Coherent suppression of electromagnetic dissipation due to superconducting quasiparticles. Nature. Apr. 17, 2014;508(7496):369-72. doi: 10.1038/nature13017.
Ranzani et al., Graph-based analysis of nonreciprocity in coupled-mode systems. New J Phys. Oct. 15, 2014;17:023024. arXiv 2014;1406.4922v2. 21 pages.
Rigetti et al., Superconducting qubit in a waveguide cavity with a coherence time approaching 0.1 ms. Phys Rev B. 2012;86:100506.

(56) References Cited

OTHER PUBLICATIONS

Riste et al., Feedback Control of a Solid-State Qubit Using High-Fidelity Projective Measurement. Phys Rev Lett. Dec. 2012;109(24):240502. arXiv:1207.2944v1 [cond-mat.mes-hall]. 9 pages.
Riste et al., Millisecond charge-parity fluctuations and induced decoherence in a superconducting transmon qubit. Nat Commun. 2013;4:1913. doi: 10.1038/ncomms2936.
Roch et al., Observation of measurement-induced entanglement and quantum trajectories of remote superconducting qubits. Phys Rev Lett. May 2, 2014;112:170501.1-5.
Sarandy et al., Abelian and non-Abelian geometric phases in adiabatic open quantum systems. Phys Rev A. Jun. 2006;73(6):062101. arXiv:quant-ph/0507012v3. 10 pAGES.
Schackert et al., Phase-preserving amplification near the quantum limit with a Josephson ring modulator. Nature. May 2010;465(7294):64-8. arXiv:0912.3407v1. 20 pages.
Schindler et al., Quantum simulation of open-system dynamical maps with trapped ions. Nature Phys. May 19, 2013;9:361-7. arXiv:1212.2418v1. 28 pages.
Segall et al., Dynamics and energy distribution of nonequilibrium quasiparticles in superconducting tunnel junctions. Physical Review B. 2004;70(21):214520.
Shankar et al., Autonomously stabilized entanglement between two superconducting quantum bits. Nature. Dec. 19, 2013;504(7480):419-22. doi:10.1038/nature12802. Epub Nov. 24, 2013.
Shaw et al., Kinetics of nonequilibrium quasiparticle tunneling in superconducting charge qubits. Phys Rev B. Jul. 1, 2008;78:024503.
Siddiqi et al., an RF-Driven Josephson Bifurcation Amplifier for Quantum Measurements. Phys Rev Lett. Nov. 10, 2004;93:207002. arXiv:cond-mat/0312623v1. 4 pages.
Silveri et al., Theory of remote entaglement via quantum limited phase-preserving amplification. Phys Rev A. Jun. 7, 2016;93:062310.
Sirois et al., Coherent-state storage and retrieval between superconducting cavities using parametric frequency conversion. Appl Phys Lett. Apr. 30. 2015;106:172603.
Sjoqvist, Trends: A new phase in quantum computation. Phys. 2008;1:35. doi: 10.1103/Physics.1.35. 6 pages.
Sliwa et al., Reconfigurable Josephson Circulator/Directional Amplifier. Phys. Rev. X 2015;5:041020.
Smith et al., Low noise papametric amplifier. IEEE Transactions on Magnetics. Mar. 1985;Mag-21(2):1022-8.
Spietz et al., Input Impedance and Gain of a Gigahertz Amplifier Using a DC SQUID in a Quarter Wave Resonator. Appl Phys Lett. Jun. 17, 2008;93:082506. arXiv:0806.2853v1. 4 pages.
Sun et al., Measurements of Quasiparticle Tunneling Dynamics in a Band-Gap-Engineered Transmon Qubit. Phys Rev Lett. Jun. 8, 2012;108:230509. doi: 10.1103/PhysRevLett.108.230509.
Sun et al., Tracking photon jumps with repeated quantum non-demolition parity measurements. Nature. Jul. 24, 2014;511(7510):444-8. doi: 10.1038/nature13436. Epub Jul. 13, 2014.
Swenson et al., High-speed phonon imaging using frequency-multiplexed kinetic inductance detectors,. App Phys Lett. Jul. 1, 2010; 96:263511.
Usadel, Generalized Diffusion Equation for Superconducting Alloys. Phys Rev Lett. 1970;25(8):507.
Vijay et al., Invited Review Article: The Josephson bifurcation amplifier. Rev Sci Instrum. Nov. 17, 2009;80:111101. doi:10.1063/1.3224703.
Vijay et al., Observation of Quantum Jumps in a Superconducting Artificial Atom. Phys Rev Lett. Mar. 18, 2011;106(11):110502.1-4.
Vijay et al., Quantum feedback control of a superconducting qubit: Persistent Rabi oscillations. Nature. Oct. 4, 2012;490(7418):77-80. doi: 10.1038/nature11505.
Vion et al., Manipulating the quantum state of an electrical circuit. Science. May 3, 2002;296(5569):886-9.
Visser et al., Fluctuations in the electron system of a superconductor exposed to a photon flux. Nat Commun. 2014;5:3130. doi: 10.1038/ncomms4130.

Vool et al., Non-Poissonian quantum jumps of a fluxonium qubit due to quasiparticle excitations. Phys Rev Lett. Dec. 12, 2014;113(24):247001. Epub Dec. 8, 2014.
Wang et al., a Schrodiner cat living in two boxes. Science. May 27, 2016;352(6289):1087.
Wang et al., Measurement and control of quasiparticle dynamics in a superconducting qubit, Nature Comms. Dec. 18 2014; 5:5836. doi:10.1038/ncomms6836.
Wang, Memristors and Superconducting Quantum Interference Filters in RF Systems. Department of Electrical and Computer Engineering, Duke University. Thesis. Aug. 18, 2014. 119 pages.
Wendin et al., Superconducting quantum circuits, qubits and computing. arXiv:cond-mat/0508729v1. Aug. 30, 2005. 60 pages.
Wenner et al., Excitation of superconducting qubits from hot nonequilibrium quasiparticles. Phys Rev Lett. Apr. 12, 2013;110(15):150502. Epub Apr. 9, 2013.
Wu et al., Time-dependent decoherence-free subspace. J Phys A: Math. Theor. Sep. 19, 2012;45(40):405305. arXiv:1205.1298v2. 7 pages.
Xu et al., Non-Adiabatic Holonomic Quantum Computation in Decoherence-Free Subspaces. Phys Rev Lett. Oct. 24, 2012;109(17):170501. arXiv:1210.6782v1. 4 pages.
Xu et al., Universal Nonadiabatic Geometric Gates in Two-Qubit Decoherence-Free Subspaces. Sci Rep. Oct. 29, 2014;4:6814. doi: 10.1038/srep06814. 5 pages.
Yaakobi et al., Parametric amplification in Josephson junction embedded transmission lines. Phys Rev B. Apr. 1, 2013;87:144301. 1-9. doi: 10.1103/PhysRevB.87.144301.
Yamamoto et al., Flux-driven Josephson parametric amplifier. Appl Phys Lett 2008 Jul.;93:042510. doi:10.1063/1.2964182.
Zanardi et al., Coherent quantum dynamics in steady-state manifolds of strongly dissipative systems. Phys Rev Lett. Dec. 17, 2014;113:240406. arXiv:1404.4673. 6 pages.
Zanardi et al., Geometry, robustness, and emerging unitarity in dissipation-projected dynamics. Phys Rev A. 2015;91:052324. arXiv:1412.6198. 8 pages.
Zanardi et al., Holonomic Quantum Computation. Phys Lett A. Nov. 15, 1999;264:94-9. 5 pages.
Zanardi et al., Noiseless Quantum Codes. Phys Rev Lett. Oct. 27, 1997;79(17):3306-9. arXiv:quant-ph/9705044v2. 4 pages.
Zanardi, Stabilizing Quantum Information. Phys Rev A. Dec. 5, 2000;63(1):012301. arXiv:quant-ph/9910016v2. 5 pages.
Zanardi, Virtual Quantum Subsystems. Phys Rev Lett. Aug. 13, 2001;87(7):077901. arXiv:quant-ph/0103030v2. 4 pages.
Zhang et al., Physical implementation of holonomic quantum computation in decoherence-free subspaces with trapped ions. Phys Rev A. 2006;74:034302. arXiv:quant-ph/0608068v1. 4 pages.
Zheng, Dissipation-induced geometric phase for an atom in cavity QED. Phys Rev A. May 10, 2012;85(5):052106. arXiv:1205.0984v2. 7 pages.
Zheng, Open-system geometric phase based on system-reservoir joint state evolution. Phys Rev A. Jun. 27, 2014;89:062118. arXiv:1405.1227v1. 8 pages.
Zhong et al., Squeezing with a flux-driven Josephson parametric amplifier. New J Phys. Dec. 2013;15:125013. doi:10.1088/1367-2630/15/12/125013.
Zhou et al., High-gain weakly nonlinear flux-modulated Josephson parametric amplifier using a SQUID array. Physical Review. 2014;89(21). 6 pages.
Zhu et al., Geometric quantum gates robust against stochastic control errors. Phys Rev A. Aug. 15, 2005;72(2):020301. arXiv:quant-ph/0407177v1. 4 pages.
Zorin, Josephson Traveling-Wave Parametric Amplifier with Three-Wave Mixing. Phys Rev Applied. Sep. 12, 2006;6:034006.
Zueco et al., Qubit-oscillator dynamics in the dispersive regime: analytical theory beyond the rotating-wave approximation. Physical Review A 80.3 2009. 6 pAGES.
Extended European Search Report for European Application No. 17739044.0, dated Jul. 19, 2019.
Bianchetti et al., Dynamics of dispersive single qubit read-out in circuit quantum electrodynamics. Phys. Rev. A. Oct. 30, 2009;80:043840.

(56) References Cited

OTHER PUBLICATIONS

Govenius et al., Parity of measurement of remote qubits using dispersive coupling and photodetection. Phys. Rev. A. Oct. 1, 2015;92(4):042305.
Shafer, Balanced Amplifier IP3 Improvement. Wayback Machine archive of Rf Café, first saved Dec. 5, 2008. http://web.archive.org/web/20081205031826/www.rfcafe.com/references/electrical/balanced-amplifier-in3-improvement.htm, 2 pages.
U.S. Appl. No. 15/029,666, Abdo et al., filed Apr. 15, 2016.
U.S. Appl. No. 16/160,897, Abdo et al., filed Oct. 15, 2018.
U.S. Appl. No. 15/914,995, Narla et al., filed Mar. 7, 2018.
U.S. Appl. No. 16/068,405, Wang et al., filed Jul. 6, 2018.

* cited by examiner

WIRELESS JOSEPHSON PARAMETRIC CONVERTER

CROSS-REFERENCE TO RELATED APPLICATIONS

This application is the national phase filing under 35 U.S.C. § 371 of International Application No. PCT/US2016/027817, filed on Apr. 15, 2016, which claims priority to U.S. Provisional Patent Application No. 62/149,419, filed on Apr. 17, 2015, each of which are incorporated herein by reference to the maximum extent allowable.

GOVERNMENT FUNDING

This invention was made with government support under grant W911NF-09-1-0514 awarded by United State Army Research Office. The government has certain rights in the invention.

DISCUSSION OF RELATED ART

There are a number of different microwave devices and components that are available for electrodynamic systems operating at microwave frequencies (e.g., frequencies between about 300 MHz and about 300 GHz). Examples of such devices and components include amplifiers, couplers, circulators, mixers, frequency converters, resonators, attenuators, antennas, and transmission lines. These devices and components may be used in a wide range of applications ranging from wireless communication systems to radar systems.

Various microwave devices and components may also be suitable for use in the field of quantum information. For example, some quantum information systems (e.g., quantum computers) may store and operate on information that is in the form of quantized states, referred to as "quantum bits" or "qubits." Operations on qubits may involve coupling microwave signals into and/or out of one or more microwave resonators, to and from superconducting integrated circuits, amplifying the signals, mixing and/or demodulating signals, etc., so that quantum computations can be carried out. Some of these operations on qubits may require the use of microwave devices and components.

Some quantum computing systems may utilize Josephson-junction-based amplifiers in an electrodynamic system that interfaces with qubits. Conventional Josephson-junction amplifiers may comprise superconducting elements formed on a substrate that are electrically connected by wire bonds to other components in the system. The amplifier may be operated at cryogenic temperatures and may provide a signal via a coaxial connector to processing electronics, which may be operated at room temperature. There may be additional components (e.g., hybrid couplers, circulators, transmission lines, etc.) connected between the amplifier and the processing electronics.

SUMMARY

Embodiments of the present disclosure relate to a Josephson-junction-based frequency-converter/amplifier (referred to generally as a "converter") that can wirelessly couple to and operate on microwave signals in an electrodynamic system. In some embodiments, the converter may be used to amplify one or more microwave signals. In some implementations, the converter may be used to convert a frequency of a microwave signal noiselessly, though other modes of operation are possible. In some applications relating to quantum information, a converter may be used at high gain to produce a quantum state known as a two-mode squeezed state.

According to some embodiments, a converter may comprise antennas connected to a plurality of Josephson junctions that are integrated with the antennas onto a single substrate. The Josephson junctions may be arranged to form a Josephson junction parametric converter (JPC). The converter may be placed in a microwave waveguide cavity, or at a junction of microwave cavities. In operation, the converter may wirelessly couple to and interact with microwaves in one or more microwave cavities and emit one or more amplified signals wirelessly via the antennas, without the need for hard-wired electrical connections (e.g., transmission lines or wire bonds) between the converter and other components in an electrodynamic system.

An advantage of a wireless Josephson parametric converter is that it provides phase-insensitive amplification (amplification that does not depend on the phase of the signal to be amplified). Further, signal losses and distortions caused by parasitic inductances and capacitances associated with hard-wired connections can be avoided, so that signal fidelity can be improved over conventional amplifying devices.

Some embodiments relate to a wireless converter for microwave signals that comprises a substrate, a plurality of first Josephson junctions formed on the substrate and connected in a ring, and a ground plane formed on the substrate adjacent to the ring. The wireless converter may further include a first antenna that is formed on the substrate and connected to the plurality of first Josephson junctions, and include a second antenna that is formed on the substrate, oriented perpendicular to the first antenna, and connected to the plurality of first Josephson junctions.

Some embodiments relate to methods of operating a wireless converter. One method of operation may comprise acts of wirelessly receiving pump energy at a first frequency by a first plurality of Josephson junctions formed on a substrate and connected in a ring, wirelessly receiving a signal at a second frequency from a first antenna formed on the substrate, wirelessly receiving an idler at a third frequency from a second antenna formed on the substrate, and converting pump energy to the second frequency and third frequency by the plurality of Josephson junctions to alter the signal and/or idler. The method may further comprise wirelessly emitting the altered signal with the first antenna and/or emitting the altered idler with the second antenna.

The foregoing and other aspects, implementations, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. Where the drawings relate to microfabrication of integrated devices, only one device may be shown of a large plurality of devices that may be fabricated in parallel. Directional references (top, bottom, above, below, etc.) made to the drawings are merely intended as an aid to the reader. A device may be oriented in any suitable manner in embodiments. The drawings are not intended to limit the scope of the present teachings in any way.

Figure 1:
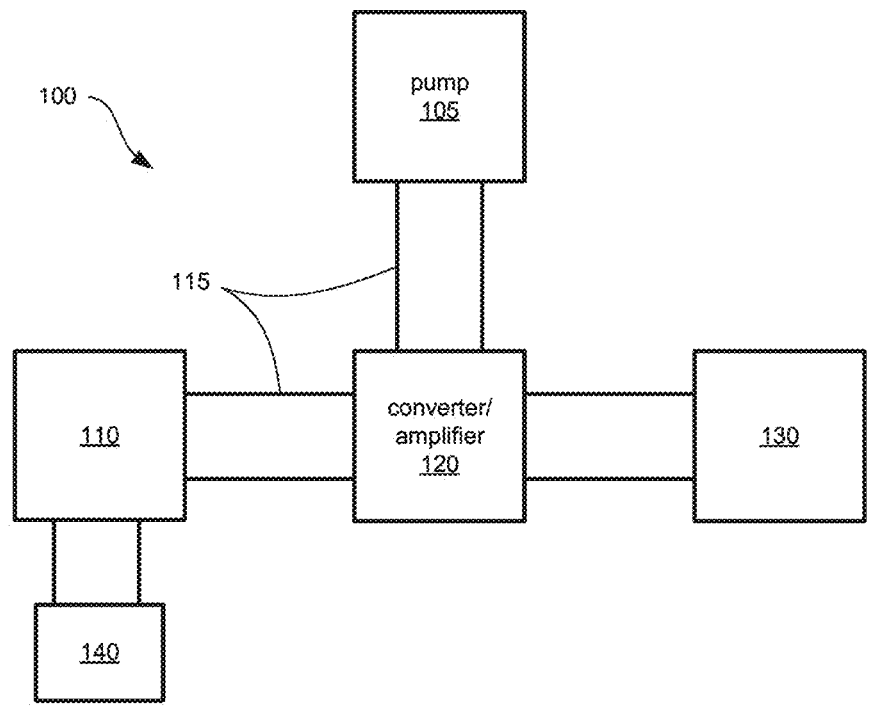
FIG. 1 depicts an electrodynamic system in which a converter may be used, according to some embodiments.

The features and advantages of the embodiments will become more apparent from the detailed description set forth below when taken in conjunction with the drawings.

DETAILED DESCRIPTION

By way of introduction, quantum information processing uses quantum mechanical phenomena, such as energy quantization, superposition, and entanglement, to encode and process information in a way not utilized by conventional information processing. For example, an initial state of a problem to be solved may be encoded onto a number of qubits. The computation may involve the manipulation and interaction of the qubits according to quantum mechanical rules. A final state of the qubits may be read out to determine a solution to the problem. Some computational problems (most notably, cracking encryption codes and evolution of complex multi-state systems) may be solved significantly faster using quantum computation rather than conventional classical computation.

The term "qubit" is used in the field of quantum information processing to refer to the encoded information itself (i.e., the quantum bit), and is also used to refer to the physical system that retains the information.

A qubit may be formed from any physical quantum mechanical system with at least two orthogonal states. The states used to encode information are referred to as the "computational basis." For example, photon polarization, electron spin, and nuclear spin are examples of two-level physical systems that may be used as qubits to encode information for quantum information processing. Different physical implementations of qubits have different advantages and disadvantages. For example, photon polarization benefits from long coherence times and simple single qubit manipulations, but suffers from the inability to create simple multi-qubit gates.

Qubits based on other physical systems have also been proposed. Qubits based on superconducting Josephson junctions include "phase qubits" (where the computational basis is the quantized energy states of Cooper pairs in a Josephson Junction), "flux qubits" (where the computational basis is the direction of circulating current flow in a superconducting loop), and "charge qubits" (where the computational basis is the presence or absence of a Cooper pair on a superconducting island). Qubits based on superconducting devices can exhibit strong qubit-qubit coupling, which can enable easier implementation of multi-qubit gates than for photonic-based qubits, for example.

Whatever the choice of the system used to form qubits, the system should allow scalability to a large number of qubits (e.g., thousands or more). For quantum information processing to become a viable technological tool, the system should be able to carefully configure and control a large number of qubits and the interactions between these qubits. For example, qubits should have long coherence times (an ability to maintain their state when not operated on), be able to be individually manipulated, be able to interact with one or more other qubits to implement multi-qubit gates, and be able to be initialized and measured efficiently.

Embodiments described in this application relate to a superconducting Josephson-junction-based frequency-converter/amplifier that can be used in quantum electrodynamic (QED) systems for quantum information processing. For example, the converter may be used to operate on microwave signals received from qubits (e.g., in an electronic read-out chain). The converter is configured to wirelessly interact with a microwave environment in which it is placed, so that deleterious effects of hard-wired links on quantum information fidelity can be reduced. Although the converter is described mainly in the context of quantum information processing in this application, it may be used in other areas of microwave signal processing, such as for optomechanical resonators, semiconductor qubits, or axion detectors, for amplification and/or frequency conversion.

FIG. 1 depicts an electrodynamic system 100 in which a frequency converter/amplifier system 120 may be used. In some embodiments, the electrodynamic system 100 may include a signal source 110 that is coupled to the converter system via a transmission link 115. A transmission link may also couple energy from a pump source 105 to the converter 120. In some cases, signal-processing electronics 140 may also be coupled to receive one or more amplified signals or a frequency-converted signal from the converter. The converter 120 may include superconducting circuit elements and be maintained at cryogenic temperatures when in operation. A signal received from the signal source 110 may be frequency converted and/or amplified by the converter 120, and the amplified signal or frequency-converted signal may be transmitted to processing electronics 140 or other downstream components. In some embodiments, a microwave circulator at the source 110 may couple the signal to and from the converter 120 and to the processing electronics 140. In some implementations, a second "idler" source 130 may be coupled to the converter system via a transmission link 115, and a returned idler output may be coupled to the same or different processing electronics. When operating on a signal received from the signal source 110, the converter may convert energy at a pump frequency $\omega_p$ from the pump source 105 to energy in the amplified signal at a second frequency $\omega_s$ (referred to as the "signal" frequency) and to energy at a third frequency $\omega_i$ (referred to as the "idler" frequency).

In some embodiments, a signal source 110 may comprise one or more qubits of a quantum information processing system. In some cases, a signal source 110 may comprise an output from a quantum logic gate. According to some embodiments, a transmission link may comprise a microwave strip line, waveguide cavity, or a coaxial cable (e.g., an sub-miniature version A (SMA) microwave cable). A pump source 105 may comprise a microwave oscillator operating at a pump frequency $\omega_p$ between about 3 GHz and about 25 GHz, which may or may not be tunable in frequency, and may be tunable in power.

The inventors have recognized and appreciated that integration of Josephson-junction-based amplifiers into QED systems such as that depicted in FIG. 1 can be challenging, because of interconnections that may be needed between the amplifier and adjacent components in the system (e.g., waveguides, coaxial or microstrip transmission links, etc.). Additionally, these amplifiers may require ancillary microwave components like directional couplers and/or hybrid couplers to operate. As a result, potentially undesirable consequences affecting signal quality may arise. For example, hard-wired links to some microwave components can introduce parasitic inductances, capacitances, and losses that can reduce measurement efficiency and thus the fidelity of qubit readout. Also, the hard-wired links and some components may result in a complicated frequency dependence of impedances seen by an amplifier, which can limit the amplifier's tunability and performance.

Figure 2A:
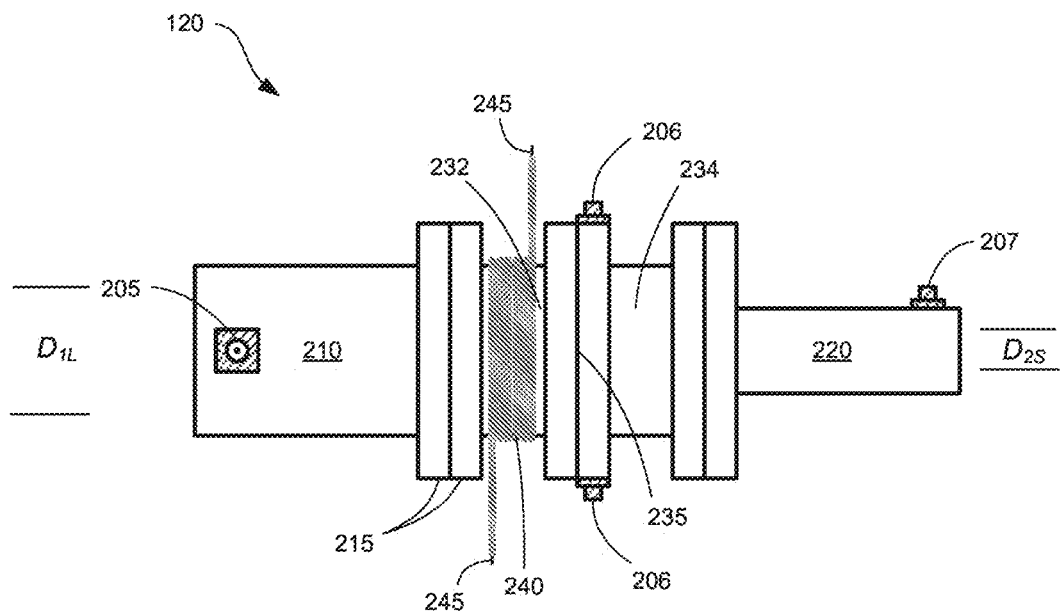
FIG. 2A depicts a microwave frequency-converter/amplifier system, according to some embodiments.

Further details of a converter system 120 are depicted in FIG. 2A, according to a first embodiment. An active circuit (shown in FIG. 3) of the converter may be formed on a substrate and mounted at a junction region 235 between a first microwave waveguide 210 and a second microwave waveguide 220. The converter system 120 may further include a first waveguide extension 232 and a second waveguide extension 234 that are connected to the first and second waveguides, respectively. In some embodiments, a converter system 120 may further include a conductive coil 240 wound around one of the waveguides or waveguide extensions and having leads 245 that can be connected to a current source to flow current through the coil and create a magnetic field within the junction region 235 of the waveguides. The waveguides 210, 220 and waveguide extensions 232, 234 may be connected with fasteners at mating flanges 215, for example.

In some embodiments, the first waveguide 210 and second waveguide 220 may comprise coaxial-to-microwave-cavity adapters (e.g., model WR-90 available from Fairview Microwave Inc. of Allen, Tex.), though plain microwave cavities or resonators may be used in some cases. The first waveguide 210 may include a coaxial connector 205 for providing and receiving a microwave frequency (e.g., a signal frequency) to and from a cavity of the first waveguide. The microwave cavity of the first waveguide may have a long transverse dimension $D_{1L}$ oriented in a first direction. The second waveguide 220 may have a long transverse dimension that is oriented in a direction orthogonal to the long transverse dimension $D_{1L}$ of the first waveguide 210. The second waveguide may include a coaxial connector 207 for providing and receiving a microwave frequency (e.g., an idler frequency) to and from the second waveguide 220. The first waveguide and second waveguide may be formed from highly conductive material (e.g., aluminum, copper, or any other suitable conductive material).

The first waveguide extension 232 and second waveguide extension 234 may be formed from highly conductive and non-magnetic material such as copper or aluminum. The first waveguide extension may include a microwave cavity having a long transverse dimension $D_{1L}$ that approximately matches the long transverse dimension of the first waveguide 210 and is oriented in the same direction as the first waveguide. The second waveguide extension 234 may also include a microwave cavity having a long transverse dimension that matches to the long transverse dimension of the second waveguide 220 and is oriented in the same direction as the second waveguide. The overall length of a microwave cavity formed by the first waveguide 210 and first waveguide extension 232 may be selected so that a node in the microwave field at a desired signal frequency introduced at connector 205 does not occur at the junction region 235. In some cases, the length of the first waveguide 210 and first waveguide extension 232 may be greater than approximately 10 mm. The overall length of a microwave cavity formed by the second waveguide 220 and second waveguide extension 234 may be selected so that a node in the microwave field at a desired idler frequency introduced at connector 207 does not occur at the junction region 235. In some cases, the length of the second waveguide 220 and second waveguide extension 234 may be greater than approximately 10 mm. By selecting the lengths of these adjoining microwave cavities in this manner, electromagnetic coupling to the active circuit at the junction region 235 can be improved.

In some embodiments, one or both of the waveguide extensions 232, 234 may include one or more coaxial connectors 206 for applying pump energy to the converter system 120. In some cases, the coaxial connectors 206 may be located on opposite sides of a waveguide cavity as indicated in FIG. 2A. By applying a pump signal of essentially the same phase and amplitude to opposite sides of a microwave cavity, a resulting electrodynamic field excited within the cavity can be made more symmetric about a central axis of the cavity. The inventors have found that a symmetric pump field improves operation of the converter.

Figure 2B:
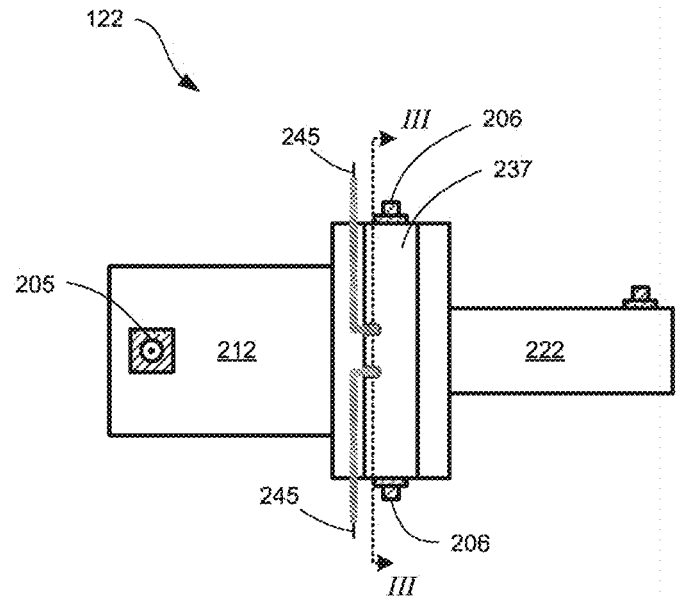
FIG. 2B depicts a microwave frequency-converter/amplifier system, according to some embodiments.

FIG. 2B depicts an alternative embodiment of a converter system 122. In some embodiments, a first microwave waveguide 212 and a second microwave waveguide 222 may be connected to a common mounting plate 237, inside of which is mounted an active circuit of the converter. A conductive coil may be mounted within the mounting plate 237, and leads 245 from the coil may extend outside the mounting plate as depicted in the drawing. The mounting plate 237 may further include one or more coaxial connectors 206 for applying pump energy to the converter.

Figure 3:
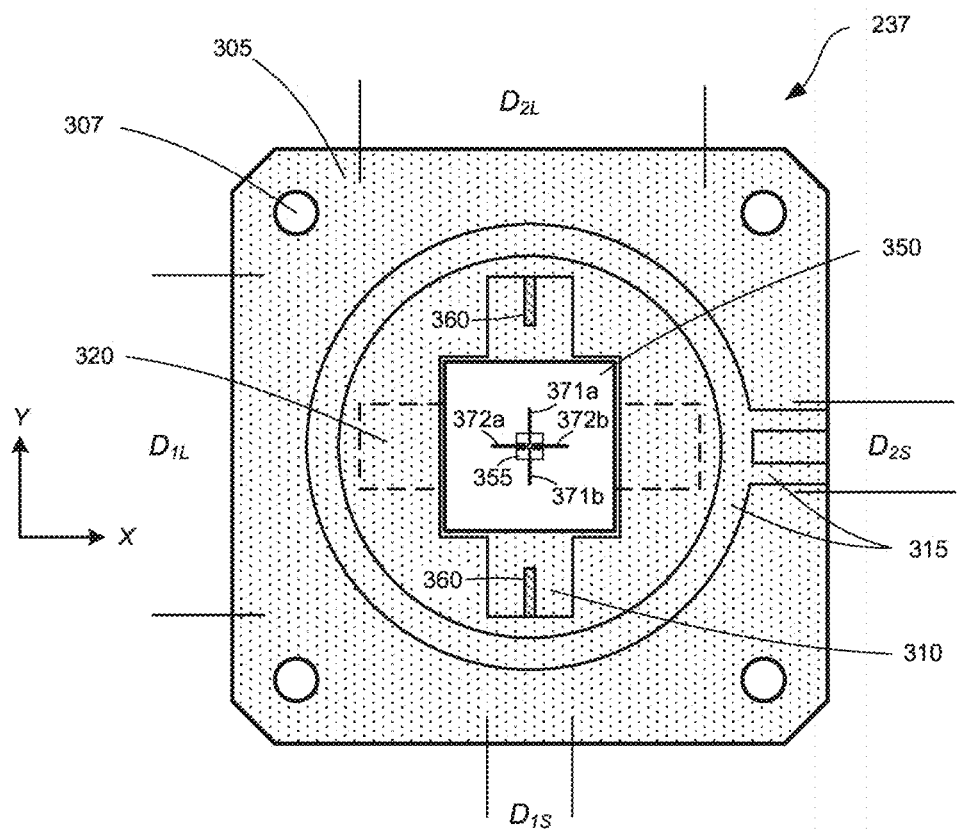
FIG. 3 depicts a mounting plate for mounting an active circuit of a converter system between two microwave cavities, according to some embodiments.

Further details of the mounting plate 237 and active circuit 350 are illustrated in FIG. 3, which is a sectional view corresponding to the cut line in FIG. 2B. According to some embodiments, an active circuit 350 may be formed on a substrate and mounted centrally within a region of the converter system where microwave cavities from the first and second waveguides or waveguide extensions 232, 234 abut. In some embodiments, there may be a first recess 310 formed in the mounting plate 237 to receive the active circuit 350. A portion of the first recess 310 may approximately match the shape and orientation of the microwave cavity of the first waveguide 212. On a reverse side of the mounting plate 237 may be a second recess 320 that approximately matches a size and orientation of a microwave cavity of the second waveguide 222. The two recesses 310, 320 may meet at a center of the plate 237 to form a clear opening through the plate. For the embodiment depicted in FIG. 2A, the cavities of the two waveguide extensions 232, 234 may meet at the junction region 235, where the active circuit 350 is mounted. There may be holes 307 in the mounting plate 237 for fastening the first waveguide 212, the second waveguide 222, and the mounting plate 237 together.

In some implementations, the mounting plate 237 may include trenches 315 formed in the plate to receive a conductive coil, such as the coil depicted in FIG. 2A, and allow leads 245 to extend outside the plate. The plate body 305 may be formed from a non-magnetic material (for example, aluminum or copper). Applying a current to a coil in the trenches 315 can produce a magnetic flux flowing through the active circuit 350 (in a direction into or out of the drawing sheet). By locating a coil closer to the active circuit, less current is needed to generate the magnetic flux, and a more uniform magnetic field may be produced at the active circuit. The trench 315 surrounding the active circuit need not be circular and may be any suitable shape. In some embodiments, a coil may be placed within a recess 310, for example. Although a coil could be integrated on the same substrate as the active circuit 350, the integration may require hard-wired electrical connections to the substrate.

FIG. 3 shows that the long transverse dimensions $D_{1L}$, $D_{2L}$ of the two waveguide cavities are arranged essentially orthogonal to each other. The active circuit 350 may be located centrally and at the junction of the two waveguide cavities, as depicted. The active circuit may include an integrated first antenna 371 having two antenna halves 371a, 371b and an integrated second antenna 372 having two antenna halves 372a, 372b. The first antenna 317 may be configured to wirelessly couple to and/or excite microwaves in the first waveguide 212 (or 210), and the second antenna may be configured to wirelessly couple to and/or excite microwaves in the second waveguide 222 (or 220).

By elongating the two microwave cavities in a transverse dimension, each cavity may support polarized microwaves. For example, the first microwave cavity may be oriented with its long transverse dimension in the X-direction, as indicated by the recess 320, and may be shaped to support Y-directed linear polarization (electric field polarized along the Y direction), which can couple to the first antenna 371. The second microwave cavity may be shaped and oriented to support X-directed linear polarization, which can couple to the second antenna 372. Accordingly, a signal frequency may couple to the first antenna 371 and an idler frequency may couple to the second antenna 372. By having orthogonal polarizing microwave cavities and coupling antennas 371, 372, direct cross-coupling of a signal and idler microwaves between the first and second waveguides is reduced which improves the fidelity of signals processed from the converter.

According to some embodiments, a short transverse dimension $D_{1S}$ of the first microwave cavity may be between about 0.05 $\lambda_s$ and about 0.5 $\lambda_s$, where $\lambda_s$ is the wavelength of a desired signal frequency $\omega_s$ to be supported by the first waveguide 210 (or 212). The first antenna 371 may have an end-to-end length that is less than or approximately equal to the short transverse dimension of the first microwave cavity (e.g., between approximately 0.1 $D_{1S}$ and approximately $D_{1S}$). A short transverse dimension $D_{2S}$ of the second microwave cavity may be between about 0.05 $\lambda_i$ and about 0.5 $\lambda_i$, where $\lambda_i$ is the wavelength of a desired idler frequency $\omega_i$ to be supported by the second waveguide 220 (or 222). The second antenna 372 may have an end-to-end length that is less than or approximately equal to the short transverse dimension of the second microwave cavity. The long transverse dimension $D_{1L}$, $D_{2L}$ of each microwave cavity may be approximately equal to twice the short transverse dimension in some embodiments, though longer or shorter dimensions may be used in other embodiments.

At locations near the active circuit 350, there may be one or more conductors 360 that protrude through one or more corresponding holes in the plate 237 (or waveguide extensions 232, 234) into a microwave cavity and connect to the coaxial connectors 206 (not shown in FIG. 3). The conductors 360 may be used as antennas to deliver microwave pump energy wirelessly into the microwave cavities to excite the active circuit 350. Although depicted as protruding from short edges of a waveguide cavity, the conductors 360 may protrude from the centers of long edges of the waveguide cavities, and there may be pairs of conductors 360 on both sides of the active circuit 350 (e.g., extending into the first and second waveguide cavities). The conductors may, in some cases, be flush with an edge surface of a microwave cavity or may extend up to 2 mm into the microwave cavity. The conductors may connect to center conductors of SMA cables, and each be excited with a microwave signal having essentially a same phase and amplitude.

Figure 4A:
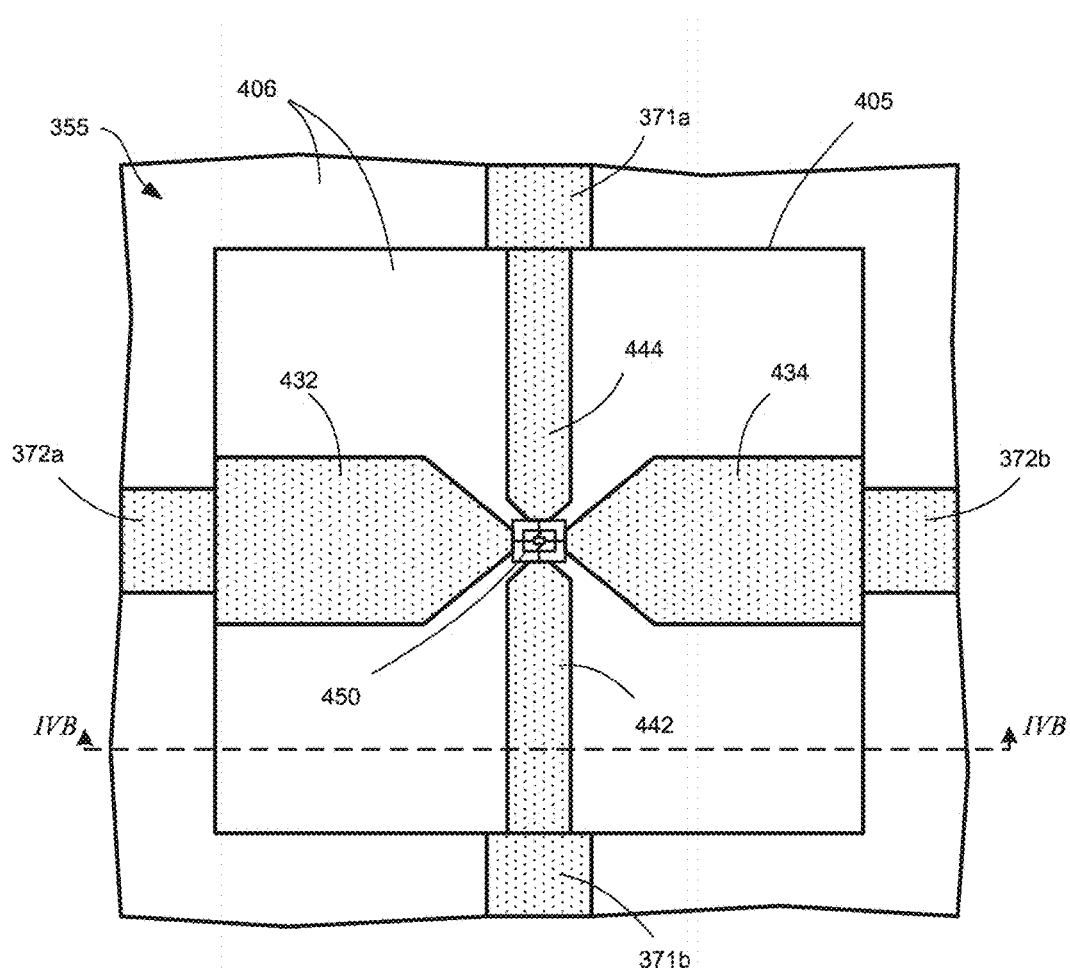
FIG. 4A depicts elements of an active circuit for a microwave converter, according to some embodiments.
Figure 4B:
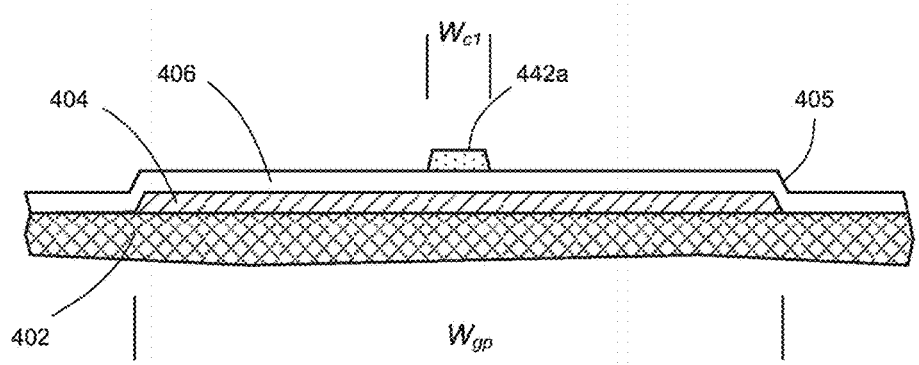
FIG. 4B is a sectional view of elements of an active circuit corresponding to the cut line in FIG. 4A.

At the center of the active circuit 350 there may be a ground-plane region 355 containing additional circuitry. Further details of circuitry in the ground-plane region are shown in FIG. 4A and FIG. 4B, according to some embodiments. The ground-plane region 355 may include capacitors 442, 444, 432, 434 connected to the first antenna 371 and second antenna 372 and also connected to converter circuitry 450. The periphery 405 of the ground-plane region 355 may be rectangularly shaped, though other shapes may also be used, and comprise a step in surface height, as seen in FIG. 4B.

In the ground-plane region, there may be a conductive film 404 formed in any suitable shape on a substrate 402 using any suitable microfabrication techniques. The conductive film 404 may support superconductivity and serve as a ground plane or reference potential plane for the active circuit. The conductive film 404 may be formed from one or any suitable combination of the following materials: niobium, aluminum, niobium nitride, niobium titanium nitride, titanium nitride, and rhenium. Other materials that support superconductivity may be used additionally or alternatively in some cases. A thickness of the conductive film may be between approximately 30 nm and approximately 500 nm, depending on the material selected. A lateral dimension of the ground plane may be between approximately 200 microns and approximately 1 mm. The substrate may comprise an insulator (e.g., sapphire, quartz, fused silica, a ceramic, a semiconductor), and may or may not be mounted on a carrier.

An insulating layer 406 (for example, an oxide or nitride) may be deposited over the conductive film 404 and have a thickness between about 50 nm and about 250 nm. Additionally, conductive plates may be formed over the insulating layer and portions of the conductive film 104 using microfabrication techniques to form a first capacitor 442, a second capacitor 444, a third capacitor 432, and a fourth capacitor 434. FIG. 4B depicts a conductive plate 442a of the first capacitor 442. The size of the conductive plates and thickness of the insulating layer may be selected to provide desired capacitances for the four capacitors. For signal and idler frequencies in a range between about 6 GHz and about 12 GHz, the values of capacitances may be between about 6 pF and about 20 pF. The first and second capacitors 442, 444 may connect to the first half and second half of the first antenna 371, and the third and fourth capacitors 432, 434 may connect to the first half and second half of the second antenna 372.

In some embodiments, a material that is used to form conductive plates of the capacitors 442, 444, 432, 434 may support superconductivity. The same material may be used to form the first and second antennas 371, 372, and may also be used to form converter circuitry 450 described in further detail below. Examples of material used to form the conductive plates and converter circuitry include one or a combination of the following materials: aluminum, niobium, niobium nitride, niobium titanium nitride, titanium nitride, and rhenium. In some implementations, portions of the converter circuitry, conductive plates for the capacitors, and the antenna halves may be formed in a same layer of material deposition and be electrically connected. According to some embodiments, a superconducting critical temperature $T_{c1}$ for the material used to form the converter circuitry 450 is less than a superconducting critical temperature $T_{c2}$ for the material used to form the conductive film 104.

Figure 4C:
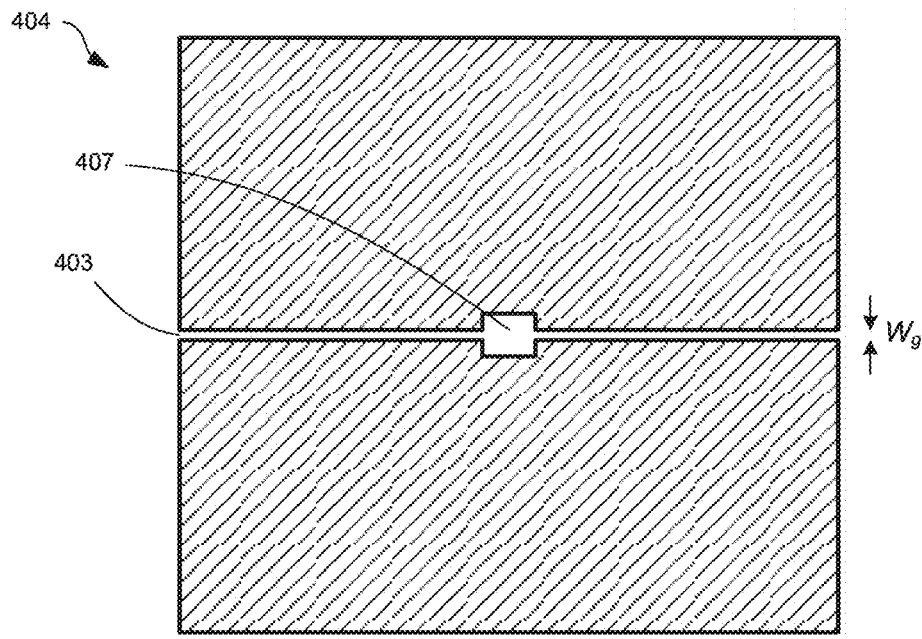
FIG. 4C depicts a reference potential plane of an active circuit for a microwave converter, according to some embodiments.

An example pattern of a conductive film 404 that is used to provide a reference potential plane is depicted in FIG. 4C, though other patterns may be used. The conductive film 404 may be patterned in an annular shape to have a central open area 407 in which the converter circuitry 450 is located. The inventors have recognized and appreciated that the converter may be tuned in frequency by applying magnetic flux through the converter circuitry, and therefore recognize that a cut or gap 403 across the conductive film 404 is needed to allow flux to pass through the conductive film when the conductive film is in a superconducting state. The gap 403 may have a width $W_G$ that is between approximately 50 nm and approximately 10 microns wide, though the narrower widths may contribute parasitic capacitance. The inventors have further recognized and appreciated that improved performance of the converter circuitry is obtained when the gap 403 is oriented along an axis of symmetry of the first antenna 371 or second antenna 372. By orienting the gap 403 along an axis of symmetry, cross coupling between the two polarized signal and idler microwaves can be reduced. In some embodiments, there may be an additional cut running across the conductive film 404 that is orthogonal to the first cut. In some cases, there may be a single cut extending from the open area 407 in the conductive film 404 to an edge or corner of the conductive film 404 (e.g., extending along a direction of one antenna half or at an angle to an antenna half.

Figure 4D:
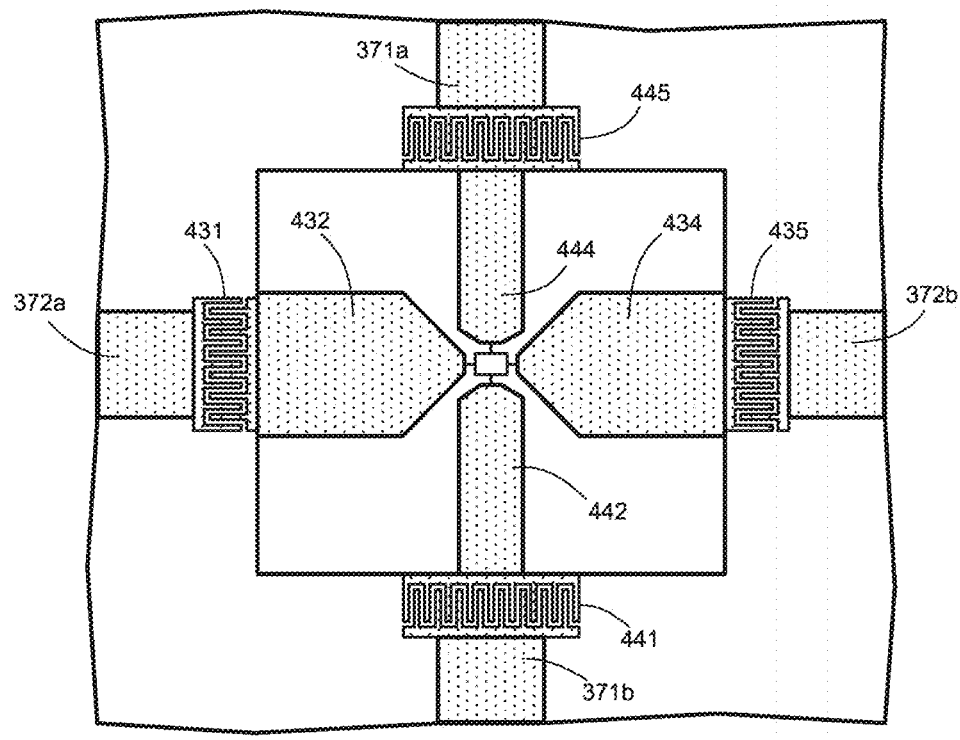
FIG. 4D depicts elements of an active circuit for a microwave converter, according to some embodiments.

FIG. 4D depicts an alternative embodiment of elements of an active circuit near the ground-plane region 355. In this embodiment, there may be interdigitated capacitors 441, 445, 431, 435 connected to the antenna halves and located adjacent to the ground-plane region. The interdigitated capacitors may be formed from a single layer of conductive material. The interdigitated capacitors may be used alternatively to or in addition to the parallel-plate capacitors. The interdigitated capacitors may be connected in series between the antennas and converter circuitry. In some embodiments, the capacitance of an interdigitated capacitor may be tuned by changing a number of fingers on the capacitor, the space between fingers, and the length of the fingers. This may allow fine tuning of the active circuit (e.g., changing Q values of the circuit) for improved frequency conversion or amplification at signal and/or idler frequencies.

In some embodiments, antennas may not be used in combination with the interdigitated capacitors. Instead, the interdigitated capacitors may connect to integrated wire bonding pads on the same substrate. Wire bonds may then be made between the bond pads and signal, idler, and/or pump sources. Further, a ground plane that is cut symmetrically with respect to one or both antenna axes (e.g., as depicted in FIG. 4C) may be used.

Figure 5A:
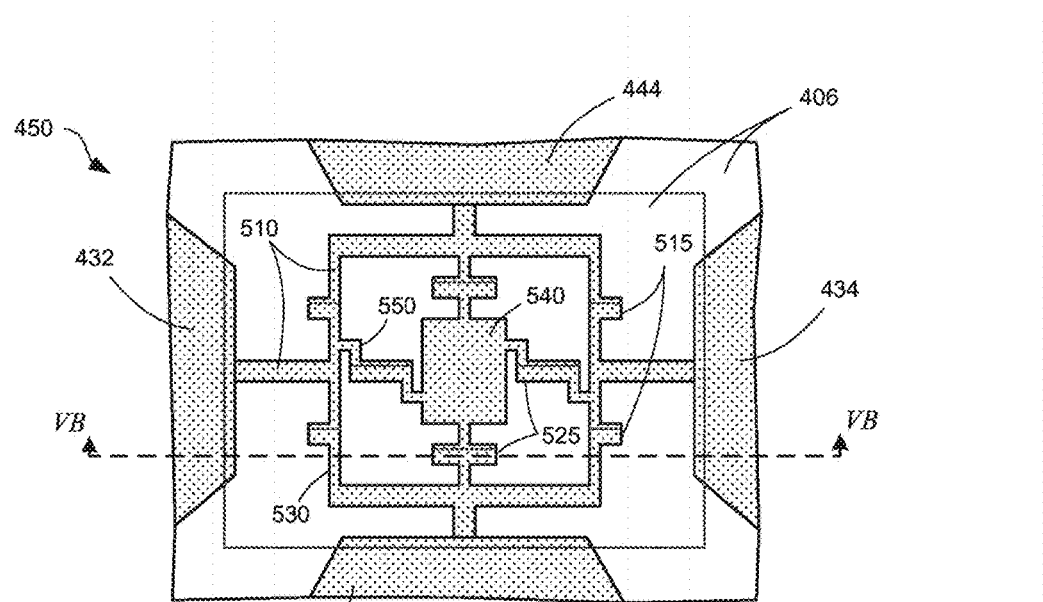
FIG. 5A depicts elements of a converter circuit, according to some embodiments.
Figure 5B:
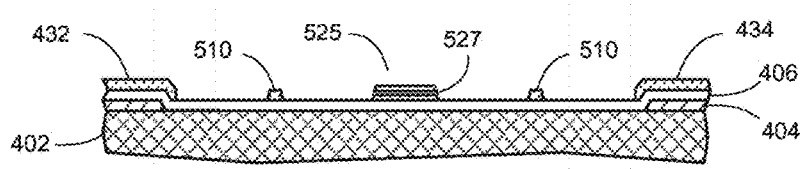
FIG. 5B is a sectional view of elements of a converter circuit corresponding to the cut line in FIG. 5A.

Further details of an embodiment of converter circuitry 450 are depicted in FIG. 5A and FIG. 5B, which is an elevation view corresponding to the cut line shown in FIG. 5A. In some embodiments, converter circuitry may comprise a plurality of Josephson junctions that are arranged to form a Josephson parametric converter (JPC). Parametric amplifiers (paramps) based on Josephson junctions, such as the Josephson parametric converter (JPC), can play important roles in the quantum non-demolition (QND) readout chain of superconducting qubits. It is likely that paramps will continue to be used in future systems involving quantum error correction and other quantum information processing applications. According to some embodiments, there may be a first plurality of Josephson junctions 515 that are connected together by conductive traces 510 to form an outer ring 530. There may be a second plurality of Josephson junctions 525 that are connected to a center pad 540 and to nodes on the outer ring between the first Josephson junctions 515, forming interior circuit loops having two or more Josephson junctions in each interior loop. Nodes on the outer ring may be connected to plates of the capacitors (e.g., capacitors 442, 444, 432, 434) that connect to the halves of the first and second antennas 371, 372.

According to some embodiments, the Josephson junctions 515, 525 may be formed using a suspended bridge mask formed, for example, from a poly(methylmethacrylate)/methylmethacrylate bilayer resist and a double angle evaporation, as described in G. J. Dolan, "Offset masks for lift-off photoprocessing," *Applied Physics Letters*, Vol. 31, No. 5, pp. 337-339, 1977, which is incorporated herein by reference. A first deposition may be carried out at a first angle to form a first contact of the junction, which is followed by a second deposition deposited at a second angle to form a second contact of the junction. Between the two depositions, a thin, barrier layer 527 may be formed (e.g., by oxidation) over the first deposition at the junctions to provide a potential barrier through which Cooper pairs tunnel. According to some embodiments where the signal and idler frequencies are between about 6 GHz and about 12 GHz, the first junctions 515 may have critical current values between about 4 µA and about 10 µA, and the second junctions 525 may have critical current values between about 8 µA and about 15 µA. In some implementations, the first junctions 515 may have critical current values between about 1 μA and about 2 μA, or between about 2 μA and about 4 μA The first junctions 515 may contribute to parametric amplification by the circuit, and the second junctions 525 may not. The second junctions may help stabilize the circuit and permit magnetic flux biasing of the circuit.

According to some embodiments, an active circuit 350 of a microwave converter comprises a lumped-element, Josephson parametric converter that is coupled directly and wirelessly to microwave waveguide cavities using antennas. The lumped-element JPC may include circuit elements having sizes appreciably less than the wavelengths of microwave radiation that couple to the circuit (e.g., less than ¼ wavelength). Due to the size difference, electromagnetic propagation effects within the elements of the JPC may be ignored. A benefit to having orthogonal linear polarizations in the adjoining microwave waveguides is that the polarizations better match to differential drives that are applied to the converter to drive the correct current pattern through the Josephson junctions 515 of the outer ring 530.

Figure 6:
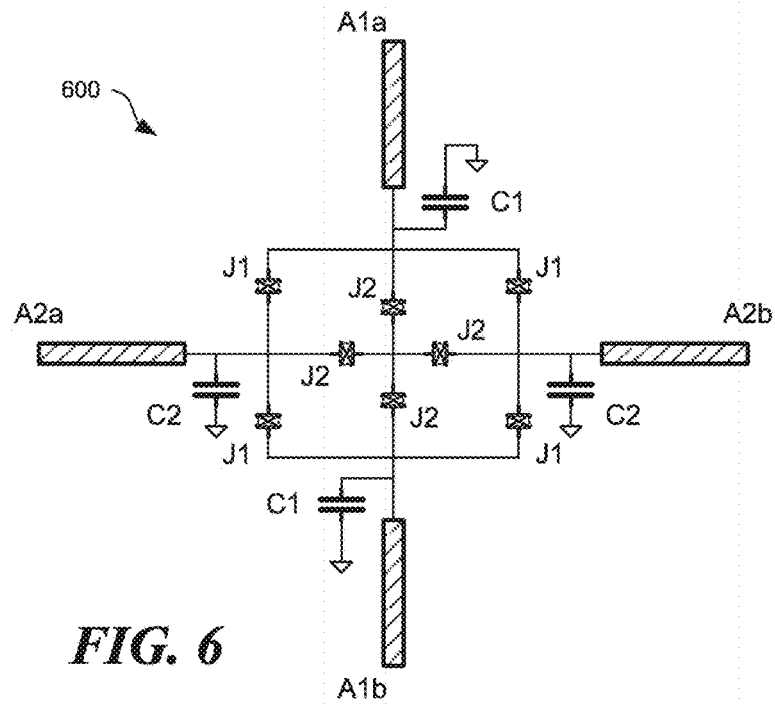
FIG. 6 is a circuit schematic that corresponds to an active circuit for a microwave converter, according to some embodiments.

A circuit schematic 600 of an active circuit 350 for a microwave converter, according to one example, is depicted in FIG. 6. In some embodiments, an active circuit may comprise a first antenna half A1a and a second antenna half A1b of a first antenna A1 that are connected to a plurality of Josephson junctions J1, J2 connected as shown in the drawing. Capacitors C1 having essentially the same value may connect between a reference potential and nodes that are between the first antenna halves and the Josephson junctions. The first antenna may be sized and arranged to receive and/or transmit microwave signals of a first polarization at a signal frequency for the converter. The arrangement of Josephson junctions J1, J2 contributes an inductance for the converter circuit and may contribute parasitic capacitance. The value of capacitors C1 may be selected to tune the converter to a desired operating frequency for the signal input. The first antenna may then be designed (e.g., its length selected) to match an impedance of the junction and capacitor circuitry to the impedance of the first antenna, which can improve power transfer from the antenna halves to the Josephson junctions.

An active circuit may further include a first antenna half A2a and a second antenna half A2b of a second antenna A2. The second antenna may be sized and arranged to receive and/or transmit microwave signals of a second polarization (orthogonal to the first polarization) at an idler frequency for the converter. The second antenna halves may also be connected to the plurality of Josephson junctions. Capacitors C2 having essentially the same value may connect between a reference potential and nodes that are between the second antenna halves and the Josephson junctions. The value of capacitors C2 may be selected to tune the converter input to the idler frequency, and the second antenna designed to match an impedance of the junction and capacitor circuitry to the impedance of the second antenna.

Operation of the active circuit 350 may be understood in reference to FIG. 2A, FIG. 3 and FIG. 6. Pump energy at a first frequency may be coupled into the cavities of the microwave waveguides 210, 220 via coaxial connectors 206 and conductors 360. This pump energy couples to the converter circuit 450 via the first and second antennas, and drives current through the Josephson junctions. Because of their non-linear behavior and arrangement in the circuit, the Josephson junctions form a non-linear oscillator that couples wirelessly via the antennas to microwave radiation in the adjacent cavities. With sufficient non-linearity, pump energy (i.e., pump photons) at a first frequency $\omega_p$ can be parametrically converted to energies at the signal and idler frequencies $\omega_s$, $\omega_i$ that are coupled into the microwave cavities via connectors 205, 207. In this process microwave pump photons are converted to signal and idler photons. A requirement on the signal and idler frequencies is that their sum (frequency translation with conjugation) or difference (frequency translation without conjugation) equate to the pump frequency: $|\omega_s \pm \omega_i| = \omega_p$. For signal (or idler) amplification, $\omega_s + \omega_i = \omega_p$. For frequency conversion (e.g., converting information encoded on the signal frequency to the same information encoded on the idler frequency), $|\omega_s - \omega_i| = \omega_p$. The signal and idler waves may have the same or different spatial modes within the adjoining microwave waveguides 210, 220 (or 212, 222).

Values of capacitors C1 and C2 and Josephson junction circuit inductance $L_j$ can be adjusted during manufacture (e.g., by sizing capacitive plates and junction contacts) roughly tune device operation to a desired frequency range. The converter may also contain additional or stray inductances $L_{stray}$ from interconnects. The values of C1 and $L_j$ can be selected to give the active circuit a resonant frequency $\omega_r \sim [(L_j + L_{stray})C]^{-0.5}$ that is approximately equal to a signal frequency that is to be amplified by the converter, where C is the combined capacitance of capacitors C1 and C2. A desired frequency range over which the device operates may comprise a sub-range of signal frequencies having a bandwidth of about 500 MHz that lies between about 2 GHz and about 25 GHz. Fine tuning for amplification at the signal frequency may be achieved by applying electrical current to coil 240, which changes an amount of magnetic flux through the converter circuit 450. This flux induces a supercurrent in the outer Josephson junction ring that alters the non-linear behavior of the oscillator which affects the three-wave process in which the pump, signal and idler interact. The net result is to shift the frequency at which peak signal gain occurs.

Figure 7:
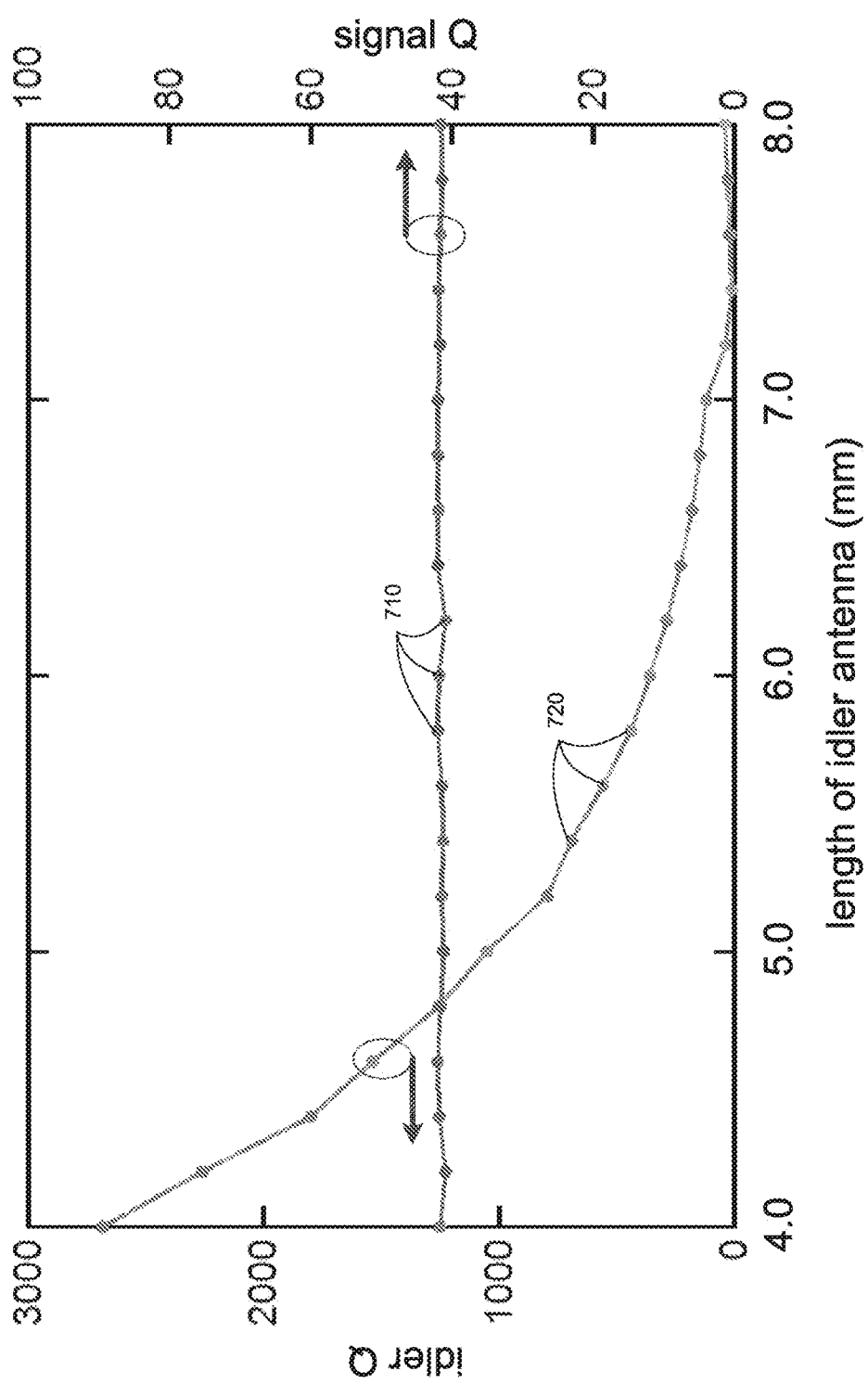
FIG. 7 shows results of calculations of oscillator Q values for an active circuit of a microwave converter and for different idler antenna lengths.

Numerical simulations were carried out to evaluate quality factors (Q values) of the converter's non-linear oscillator for signal and idler frequencies. Results from the simulations are shown in FIG. 7. For the simulation, a length of the idler antenna was changed while the signal antenna length remained fixed, and Q values for signal and idler frequencies were calculated for each idler antenna length. The first set of calculated Q values 710 for the signal frequency show that changing the length of the idler antenna does not appreciably affect the Q value for the signal frequency. This indicates good decoupling of signal and idler frequencies. Changing a length of the idler antenna by about 50% can change the Q value at the idler frequency by more than three orders of magnitude, as shown by the calculated Q values 720 for the idler frequency. A similar set of curves result when the signal antenna length is changed and the idler antenna length is constant.

The inventors have recognized and appreciated that an instantaneous gain bandwidth of a converter (a frequency bandwidth over which at least a desired signal gain can be achieved) is inversely proportional to the Q factor for the signal, and that a saturation power point of the converter (a level of signal input power at which signal gain begins to saturate) increases monotonically as the signal Q increases. Therefore, there is a tradeoff between instantaneous gain bandwidth and the converter's saturation power point. FIG. 7 illustrates that an instantaneous gain bandwidth (and as a result, the saturation power point) of a converter system 120 may be set by adjusting the length of the active circuit's antennas during fabrication. In some embodiments, the lengths of the first and second antenna may be set to provide Q values between approximately 20 and approximately 60. Depending on the operational frequency, this range of Q values may correspond to antenna lengths between about 6 mm and about 8 mm. Other values of Q may be used in other embodiments, for example to increase saturation power point at the expense of instantaneous gain bandwidth.

Figure 8A:
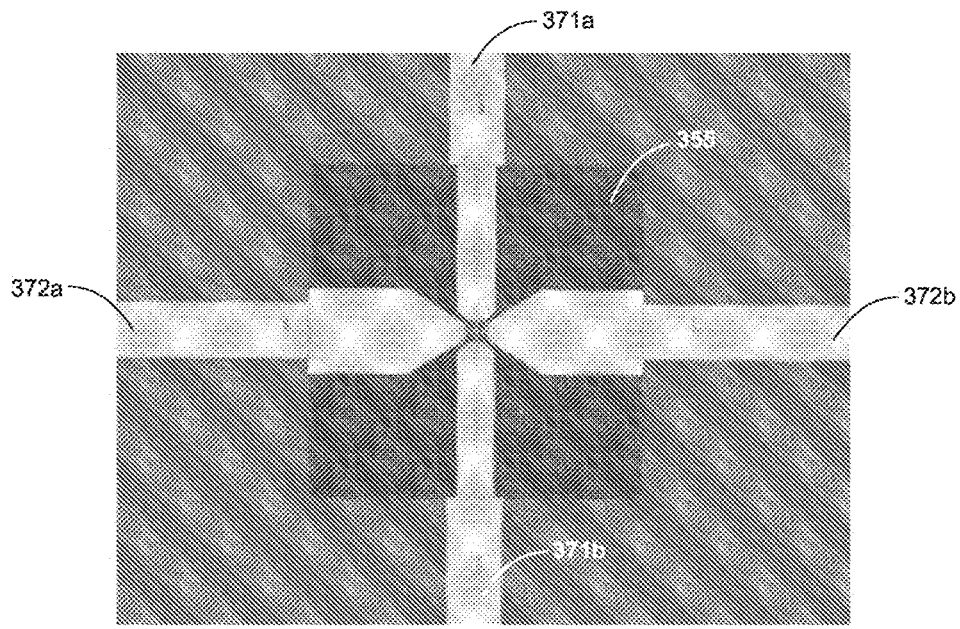
FIG. 8A is a magnified image of elements of a microfabricated, wireless Josephson parametric active circuit.
Figure 8B:
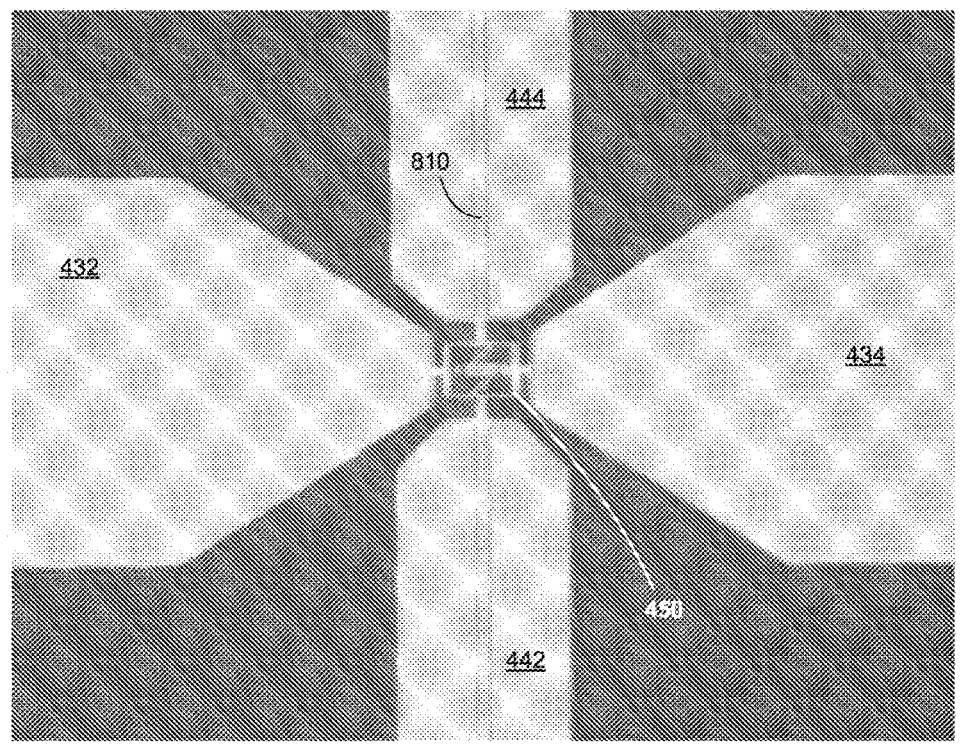
FIG. 8B is a magnified image of elements of a microfabricated, wireless Josephson parametric active circuit that shows further details of Josephson junction converter circuitry at a center of the device.

An active circuit 350 and converter system 120 were fabricated to demonstrate parametric amplification of microwave signal and idler frequencies. For this demonstration, signal amplification at about 10 GHz was desired. FIG. 8A and FIG. 8B show magnified images of portions of an active circuit 350 that was microfabricated on a sapphire substrate. The ground-plane region 355 is visible in FIG. 8A as a dark square-shaped region. The ground plane was formed from an approximately 150-nm-thick Nb film, which was patterned to have a width and length of approximately 600 μm×600 μm. Portions of the first antenna 371 and second antenna 372 that connected to parallel plate capacitors formed within the ground-plane region are also visible. The end-to-end antenna lengths were each approximately 7 mm, and were formed from aluminum.

In FIG. 8B, further details of converter circuitry 450 can be seen within an open area of the ground plane. The converter circuitry includes an arrangement of Josephson junctions like those depicted in FIG. 5A, where the smaller outer junctions were designed to have a critical current between approximately 2 μA and approximately 4 μA, and the larger junctions were designed to have a critical current between approximately 4 μA and 8 μA. To form the parallel-plate capacitors 432, 434, 442, 444, a layer of nitride approximately 160 nm thick was deposited over the substrate above the ground plane. Aluminum was also used to form plates of the parallel-plate capacitors and the converter circuitry 450. Also visible in FIG. 8B is a depression 810 running through capacitors 442 and 444. The depression is a result of a gap 403 (depicted in FIG. 4C) crossing the ground plane, which creates a divot in the top plate of the two capacitors.

The substrate having the active circuit was installed in a frequency-converter/amplifier system like that depicted in FIG. 2A and operated wirelessly. The chip was mounted between the two microwave cavities and no hard-wired connections were made to the chip. In a first demonstration, pump energy at a frequency of approximately 18 GHz was applied to the coaxial connectors 206, and a signal frequency to be amplified was applied to the first waveguide 210. The amount of pump power was varied to change an amount of gain at the signal and idler frequencies. The signal frequency was swept while the pump energy was applied to the device. Background noise was used to provide a signal at the idler frequency.

Figure 9A:
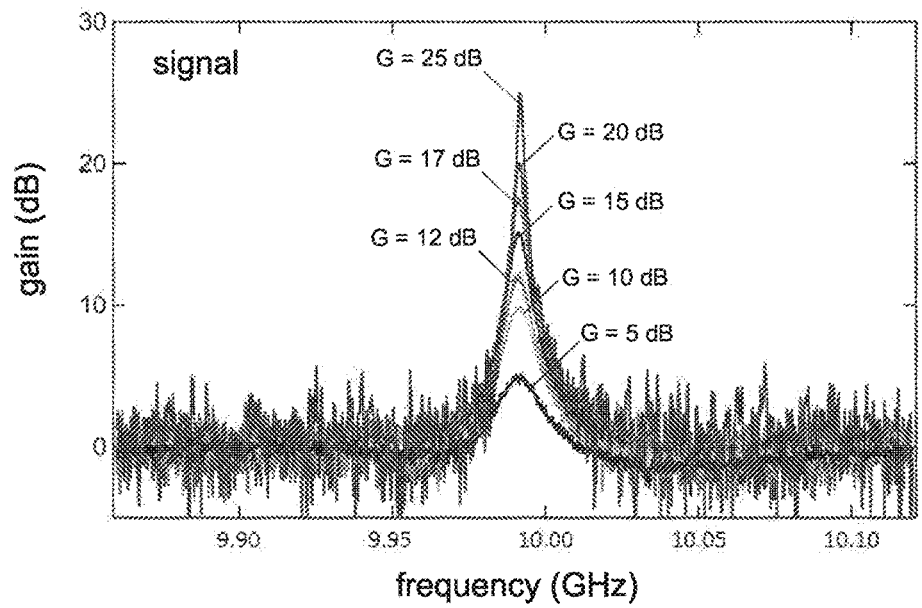
FIG. 9A shows measured gain values as a function of frequency of a wireless converter at the signal frequency.

FIG. 9A shows signal amplification as a function of signal frequency and as a function of applied pump power. The results show that the peak amplification of the signal occurs at approximately 9.99 GHz, and that the amount of gain increases with an increase in applied pump power. By increasing pump power, the gain G of the converter could be increased from about 5 dB to about 25 dB. It can also be seen from the results of FIG. 9A that the instantaneous gain bandwidth (e.g., a range of frequencies between points on the curves at which the gain falls by 3 dB) decreases with increasing signal gain. At a peak gain of 5 dB, the instantaneous gain bandwidth is approximately 13 MHz.

Figure 9B:
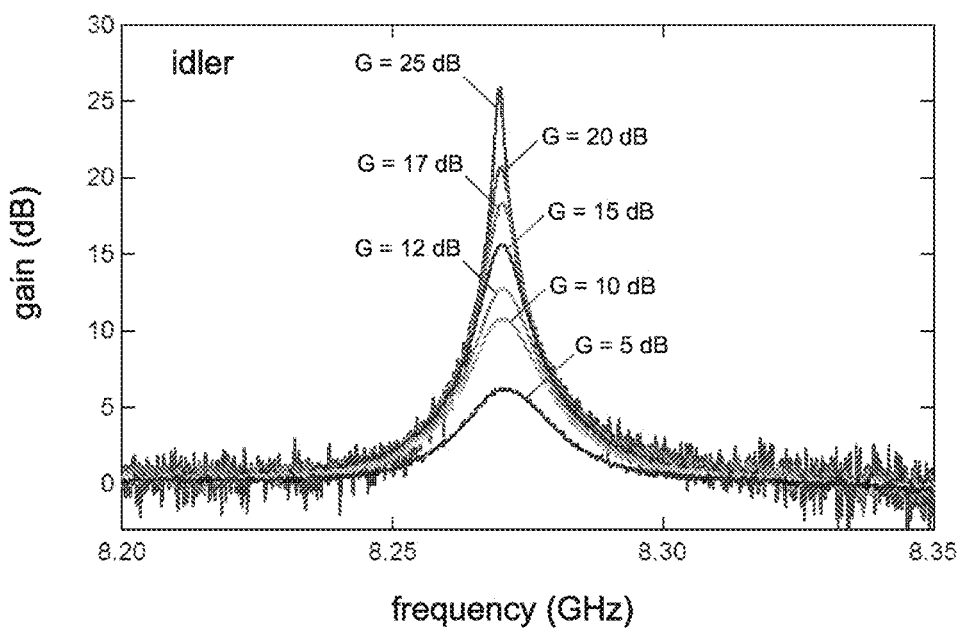
FIG. 9B shows measured gain values as a function of frequency of a wireless converter at the idler frequency.

FIG. 9B shows gain curves for the idler frequencies. Gain values between approximately 5 dB and approximately 25 dB were observed for the idler. The peak gain for the idler occurs at about 8.27 GHz. The instantaneous gain bandwidth also decreases with increasing idler gain.

Figure 10:
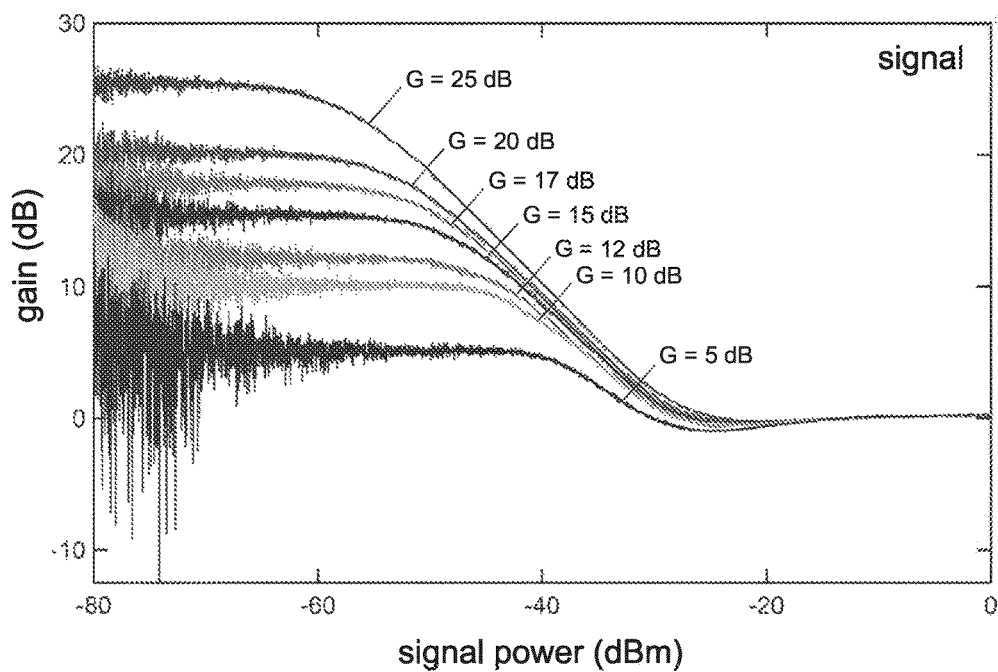
FIG. 10 shows gain saturation curves that indicate different saturation power points and dynamic ranges for a wireless converter.

Saturation power points for the converter were evaluated in a series of measurements, and the results are shown in FIG. 10. For each of these measurements, the signal frequency was set at a peak gain value G and the amount of signal power input to the device was increased by approximately 80 dB. Different peak gain values were set by changing the amount of pump power delivered to the converter, as was demonstrated in FIG. 9A. The results show that saturation of amplification and gain compression begin at different input signal powers for the different initial gain values. For example, a 1 dB compression point of the gain (which can be taken as a saturation power point of the converter) at a nominal gain setting of 5 dB occurs for a input signal power (measured at the generator) of approximately −40 dBm, whereas a 1 dB compression point for a gain setting of 25 dB occurs for a input signal power of approximately −60 dBm. For these measurements, it was estimated that the input signal was attenuated by approximately 73 dB due to connections between the signal generator and the converter. Accordingly, for a gain of approximately 25 dB, the saturation point occurs between approximately −140 dBm and approximately −120 dBm input to the converter.

The results of FIG. 10 show that the saturation power point for the converter decreases with increasing gain. The saturation power point is also a measure of the converter's dynamic range, which extends down to vacuum quantum fluctuations. The inventors have recognized and appreciated that the saturation power point for a converter scales inversely with the converter's Q factor for the signal input and also scales approximately linearly with critical current of the converter. The critical current may be adjusted by changing a junction size of the circuit's Josephson junctions and tunneling barriers. According to some embodiments, a saturation power point for converter system 120 may be determined through design of the device's Q factor for the signal input, design of the Josephson junctions, and/or amount of pump energy applied.

Figure 11:
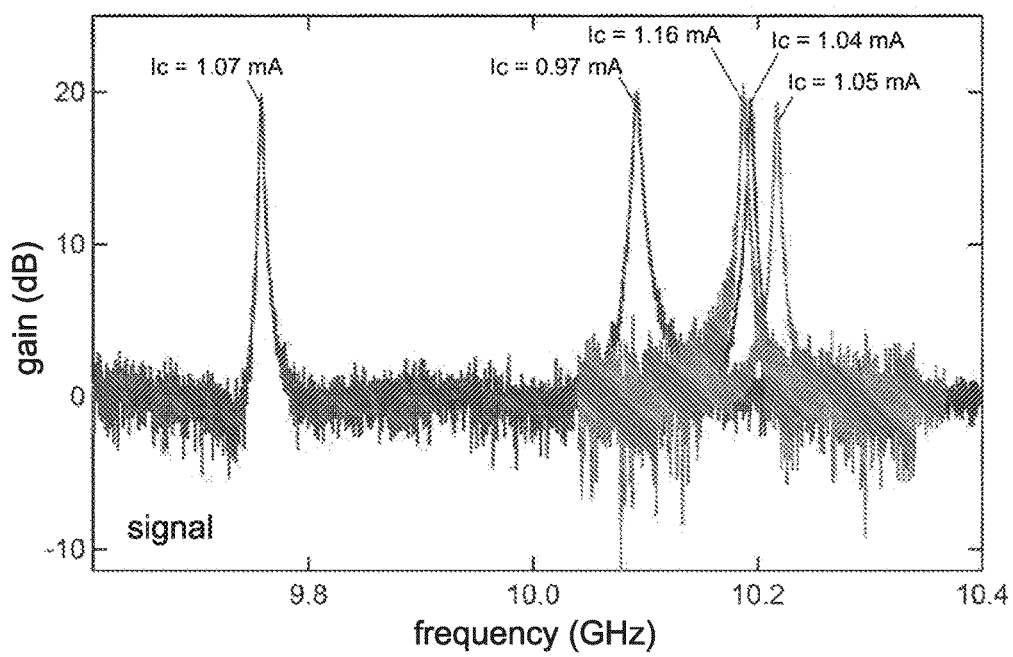
FIG. 11 shows frequency-tunable amplification of the signal frequency for a wireless converter.

Tunability of the converter system was also demonstrated, and the results are shown in FIG. 11. For this demonstration, different amounts of current $I_c$ were delivered to the conductive coil 240 to produce different levels of magnetic flux through the converter circuit 450. At each current setting, the frequency of the input signal was swept while measuring signal gain. At a first current setting of 0.97 mA through the conductive coil 240, a peak gain of the signal frequency occurred at about 10.09 GHz. At a second current setting of approximately 1.07 mA, a peak gain of the signal frequency occurred at approximately 9.76 GHz. The data point at 1.07 mA was measured at a different time from the other measurements. Between the measurements, a residual of background flux changed in the system. If the change had not occurred, the frequency observed at 1.07 mA would have occurred for a current value less than 0.9 mA. The results of FIG. 11 show that the frequency at which amplification occurs can be readily tuned over a range of at least 400 MHz.

Figure 12A:
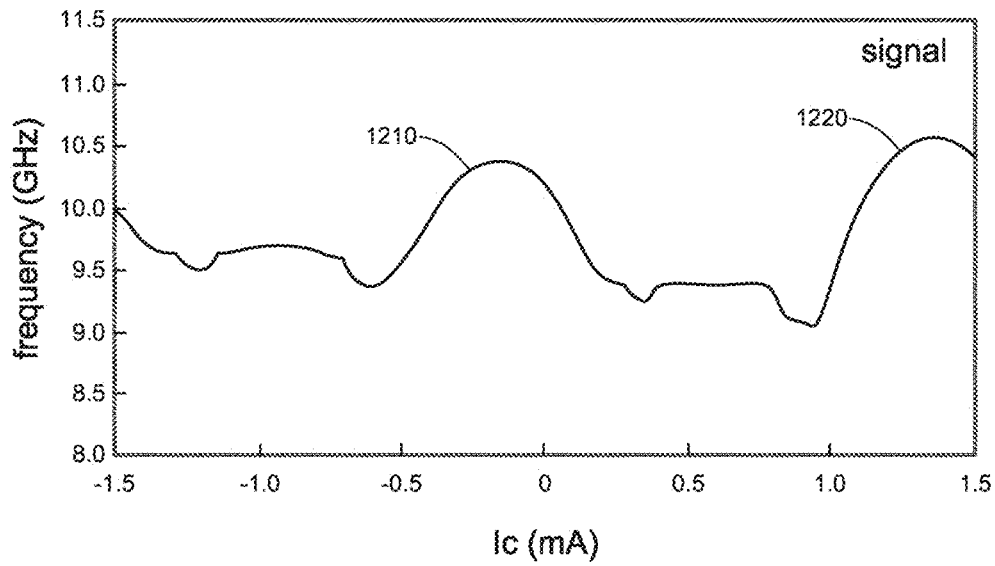
FIG. 12A shows a swept tuning curve for a signal frequency of wireless converter.
Figure 12B:
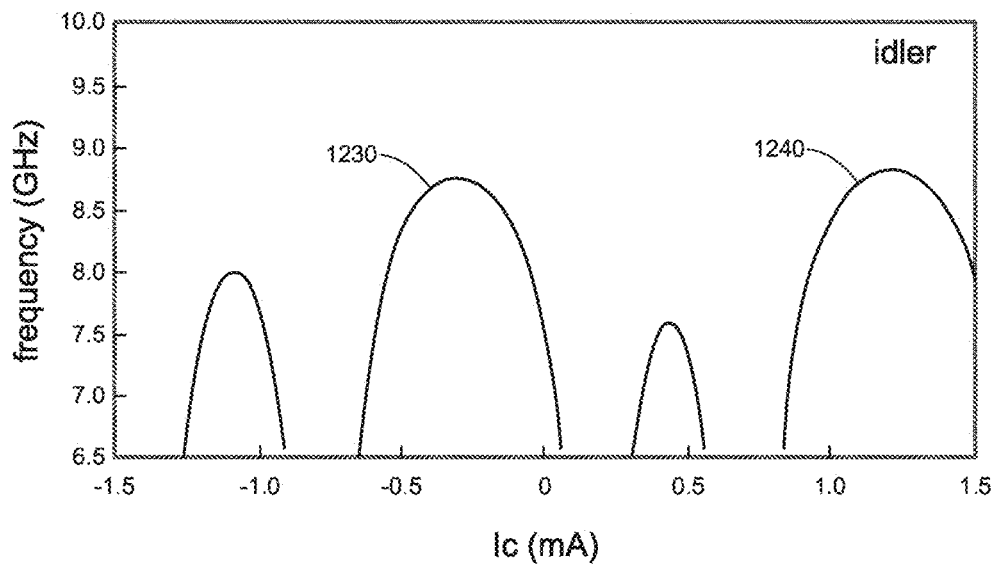
FIG. 12B shows a swept tuning curve for an idler frequency of wireless converter.

Swept tuning curves for both the signal and idler frequencies were obtained for the converter and are shown in FIG. 12A and FIG. 12B. For these measurements, the current delivered to the conductive coil 240 was varied between −1.5 mA and +1.5 mA while the signal and idler frequencies were swept to find the peak gain frequency at each current setting. Because signal gain was observed at zero current bias, the system included a residual or background magnetic field. Gain was not observed at all frequencies plotted on the traces, and the presence of gain depends upon how current is driven in the converter circuitry at the relevant fluxes and frequencies.

Referring to FIG. 12A, the highest gain values for signal amplification were observed for frequencies in the vicinity of and that included a first peak 1210 and frequencies in the vicinity of and that included a second peak 1220. Referring to FIG. 12B, the highest gains for the idler frequency were observed at frequencies that included a third peak 1230 and a fourth peak 1240. These results indicate preferred operating frequency ranges that are in the vicinity of selected peaks in the swept tuning curves.

Figure 13:
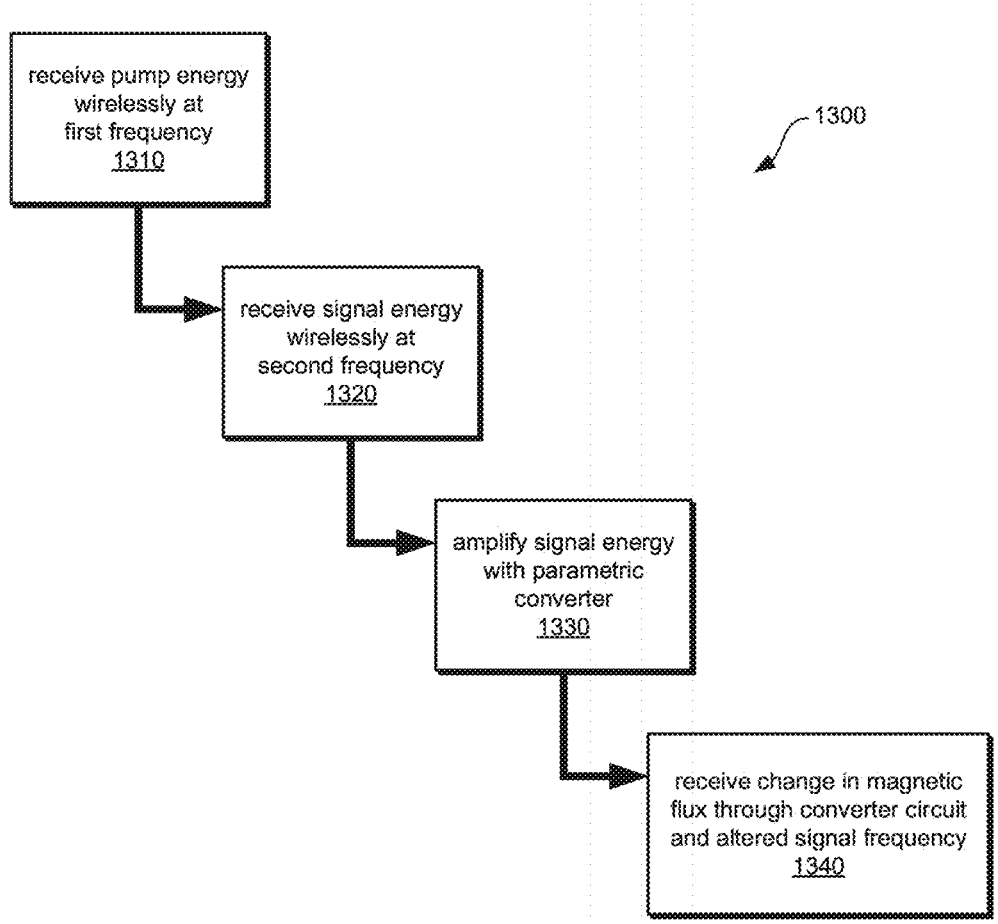
FIG. 13 depicts acts of a method for operating a wireless converter, according to some embodiments.

Methods of operating a converter system 120 are associated with various embodiments of the converter system. According to some embodiments and referring to FIG. 13, a method 1300 of operating a converter system 120 may comprise receiving (act 1310) pump energy at a first frequency wirelessly at an active circuit comprising Josephson junctions (e.g., a Josephson parametric converter circuit), and receiving (act 1320) a signal at a second frequency wirelessly at the active circuit. For example, the pump energy and signal may be provided to an active circuit, which has antennas that couple pump energy and signal energy and idler energy into the circuit from one or more microwave cavities. A method 1300 may further comprise parametrically operating on (act 1330) the signal with a converter circuit connected to the antennas. In some cases, operating on the signal may comprise parametrically amplifying the signal. In some cases, operating on the signal may comprise parametric frequency conversion of input at the signal frequency to an output at the idler frequency. According to some embodiments, the signal and idler may be re-radiated with a same antenna that is used to receive the signal, idler, and pump energy. In some embodiments, a method 1300 of operating a converter system 120 may further comprise receiving (act 1340) a change in magnetic flux through the converter circuit and receiving and/or amplifying a different signal frequency.

Figure 14:
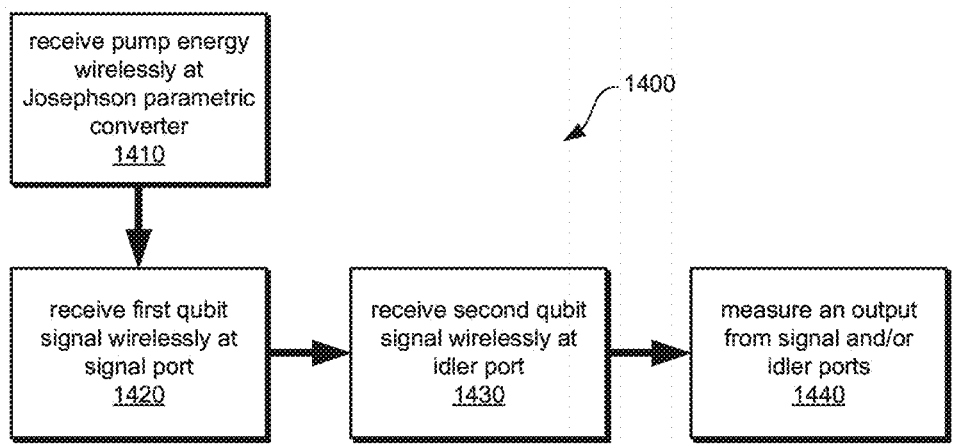
FIG. 14 depicts acts of a method for operating a wireless converter for entanglement of qubits, according to some embodiments.

Other methods of operating a converter system 120 are also contemplated, as depicted in FIG. 14. The inventors have recognized and appreciated that a converter system 120 may be used in quantum information processing to entangle qubits. In some embodiments, a method 1400 may comprise receiving (act 1410) pump energy wirelessly at a Josephson parametric converter. The pump energy may be coupled wirelessly to the converter by one or more antennas integrated on a substrate with the converter circuitry, and the substrate may be mounted between abutting microwave cavities. A method 1400 may further comprise receiving (act 1420) a first signal representative of a first qubit wirelessly at a signal port of the converter system 120, and receiving (act 1430) a second signal representative of a second qubit wirelessly at an idler port of the converter system. Microwave circulators may be connected to the signal port and the idler port, so that measurements of signals from each port can be made. According to some embodiments, the method may further comprise measuring (act 1440) an output from the signal 205 and/or idler port 207 of the converter system 120. The act of measuring can result in entanglement of the qubits (e.g., the measurement projects the qubits into an entangled state). Further details of entanglement with a parametric converter can be found in M. Silveri, et al., "Theory of remote entanglement via quantum limited phase-preserving amplification," arXiv:1507.00732 [quant-ph], July 2015, which is incorporated herein by reference.

Although example dimensions have been given for a converter system, the dimensions of a converter system may scale with the wavelengths of the microwaves with which the converter interacts. For example, at higher frequencies the dimensions of the converter circuitry, capacitors, ground plane, antennas, and waveguide cavities may be smaller than for a converter operating at lower frequencies. For high frequencies, it may be possible to form the abutting waveguides and active circuit on one or two substrates that are assembled together.

Wireless converter systems, according to the present embodiments, can contain a small number of parts, whose individual quality can be separately controlled before the final assembly. This can permit reliable fabrication of microwave frequency-converters/amplifiers that are less susceptible to spurious dissipation that leads to reduced frequency-conversion/amplification efficiency. An ability to flexibly adjust device capacitance and inductance and antenna length via microfabrication can facilitate tuning the converter for a particular application (e.g., targeting dynamical range, gain, or bandwidth for a particular application). In some embodiments, features for wireless coupling and amplification are readily manufactural, so that the amplifier may be mass produced at reasonable cost.

A wireless frequency-converter/amplifier may be used for various microwave applications and may be used as a building block for other devices. For example, two wireless JPCs may be connected together to form a low-noise directional amplifier in some embodiments.

A wireless frequency-converter/amplifier of the present embodiments may meet or exceed the gain and bandwidth performance of conventional, wired Josephson-junction-based amplifiers, and exceed the dynamic range, tunability, and efficiency of conventional wired Josephson-junction-based amplifiers. The inventors have recognized and appreciated that, in some embodiments, intermediary elements (e.g., hybrid couplers and associated printed-circuit components) may be eliminated from some microwave QED systems by using microfabricated antennas and integrated, impedance-matching elements on chips that can be mounted directly in a microwave cavity. The chip may include superconducting components that are used to carry out quantum information processing. Signals to and from the chip may be transmitted and received via a microwave waveguide-to-coaxial adapter. The simplification in the microwave environment by using a wireless architecture may reduce or eliminate sources of loss that currently limit the measurement efficiency of circuit QED systems.

Various configurations of wireless Josephson parametric converters may be implemented. The configurations include, but are not limited to, any one or combination of the following configurations.

(1) A wireless converter for microwave signals comprising a substrate, a plurality of first Josephson junctions formed on the substrate and connected in a ring, a ground plane formed on the substrate adjacent to the ring, a first antenna formed on the substrate and connected to the plurality of first Josephson junctions, and a second antenna formed on the substrate, oriented perpendicular to the first antenna, and connected to the plurality of first Josephson junctions.

(2) The wireless converter of (1), wherein the converter is configured to receive pump energy at a first frequency, the first antenna is sized to couple to electromagnetic energy at a second frequency, and the second antenna is sized to couple to electromagnetic energy at a third frequency different from the second frequency, and wherein the first frequency is essentially equal to a sum of the second and third frequencies or a difference of the second and third frequencies.

(3) The wireless converter of (1) or (2), wherein a first half of the first antenna is connected to a first node between two Josephson junctions on a first side of the ring and a second half of the first antenna is connected to a second node between two Josephson junctions on a second side of the ring, and a first half of the second antenna is connected to a third node between two Josephson junctions on a third side of the ring and a second half of the second antenna is connected to a fourth node between two Josephson junctions on a fourth side of the ring.

(4) The wireless converter of (1) or (2), wherein the plurality of first Josephson junctions is arranged to form a Josephson parametric converter.

(5) The wireless converter of (4), wherein the converter is capable of providing 20 dB gain over a tunable frequency range as wide as approximately 400 MHz.

(6) The wireless converter of (4), wherein the converter is capable of providing a gain of approximately 25 dB with approximately 1 dB compression occurring at a value of between approximately −140 dBm and approximately −120 dBm.

(7) The wireless converter of (1), further comprising a first capacitor connected to a first node between a first half of the first antenna and the ring, a second capacitor connected to a second node between a second half of the first antenna and the ring, a third capacitor connected to a third node between a first half of the second antenna and the ring, and a fourth capacitor connected to a fourth node between a second half of the second antenna and the ring.

(8) The wireless converter of (7), wherein the first through fourth capacitors comprise parallel plate capacitors formed on the substrate.

(9) The wireless converter of (7), wherein the first through fourth capacitors comprise interdigitated capacitors formed on the substrate.

(10) The wireless converter of (7), wherein the first and second capacitors have essentially a same first capacitance and the third and fourth capacitors have essentially a same second capacitance that is different from the first capacitance.

(11) The wireless converter of (7), wherein the first through fourth capacitors are formed, at least in part, from a same layer of material used to form the plurality of first Josephson junctions.

(12) The wireless converter of (11), wherein the same layer of material forms the first antenna and the second antenna.

(13) The wireless converter of (11), wherein the same layer of material supports superconductivity.

(14) The wireless converter of any one of (7), (8), and (10) through (13), wherein the ground plane forms reference potential plates for the first through fourth capacitors.

(15) The wireless converter of any one of (1), (2), and (7) through (13), wherein the ground plane comprises a conductive film patterned in an annular shape having at least one cut across the film, wherein the cut prevents circular current flow around the annularly shaped film.

(16) The wireless converter of (15), wherein the at least one cut divides the ground plane symmetrically with respect to the first antenna and/or second antenna.

(17) The wireless converter of any one of (1), (2), and (7) through (13), further comprising a second plurality of Josephson junctions located within the first plurality of Josephson junctions and connected to the first plurality of Josephson junctions.

(18) The wireless converter of (17), wherein junction sizes of the second plurality of Josephson junctions are larger than junction sizes of the first plurality of Josephson junctions.

(19) The wireless converter of (17), further comprising a conductive coil located adjacent to the ring and configured to provide magnetic flux through the ring when an electrical current is applied to the coil.

(20) The wireless converter of any one of (1), (2), and (7) through (13), further comprising a first waveguide abutting a first side of the substrate and having a first long transverse axis, a first port in the first waveguide for coupling first energy to and from the first waveguide, a second waveguide abutting a second side of the substrate opposite the first side and having a second long transverse axis that is essentially orthogonal to the first long transverse axis, and a second port in the second waveguide for coupling second energy to and from the second waveguide.

(21) The wireless converter of (20), further comprising at least a third port for coupling pump energy to the plurality of first Josephson junctions.

(22) The wireless converter of any one of (1), (2), and (7) through (13) incorporated in a quantum information processing system.

Various methods for operating a wireless Josephson parametric converters may be practiced. A method may include, but not be limited to, one or more of the following combinations of acts suitably combined.

(23) A method of operating a wireless converter comprising acts of: wirelessly receiving pump energy at a first frequency by a first plurality of Josephson junctions formed on a substrate and connected in a ring, wirelessly receiving a signal at a second frequency from a first antenna formed on the substrate, wirelessly receiving an idler at a third frequency from a second antenna formed on the substrate, converting pump energy to the second frequency and third frequency by the plurality of Josephson junctions, and wirelessly emitting an altered signal with the first antenna.

(24) The method of (23), wherein the converting frequency converts input received at the second frequency to output at the third frequency.

(25) The method of (23), wherein the converting amplifies input received at the second frequency to an amplified output at the second frequency.

(26) The method of (23), further comprising:
receiving a change in magnetic flux through the ring; and
converting pump energy to a fourth frequency different from the second frequency responsive to the change in received magnetic flux.

(27) The method of (26), further comprising applying a current to a conductive coil to control an amount of the magnetic flux.

(28) The method of any one of (23) through (27), wherein the signal is received from a first qubit and the idler is received from a second qubit and further comprising measuring at least an output signal from the first antenna.

(29) The method of (28), wherein the measuring entangles the first qubit and second qubit.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

The terms of degree used with numerical values (e.g., "approximately," "substantially," and "about") may be used to mean within ±20% of a target dimension in some embodiments, within ±10% of a target dimension in some embodiments, within ±5% of a target dimension in some embodiments, and yet within ±2% of a target dimension in some embodiments. These terms of degree include the target dimension. Embodiments also include ranges or values expressed using the exact numerical values given in the description (i.e., omitting the terms of degree).

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed:

1. A wireless converter for microwave signals comprising:
   a substrate;
   a plurality of first Josephson junctions formed on the substrate and connected in a ring;
   a ground plane formed on the substrate adjacent to the ring;
   a first antenna formed on the substrate and connected to the plurality of first Josephson junctions; and
   a second antenna formed on the substrate, oriented perpendicular to the first antenna, and connected to the plurality of first Josephson junctions,
   wherein:
      a first half of the first antenna is connected to a first node between two Josephson junctions on a first side of the ring and a second half of the first antenna is connected to a second node between two Josephson junctions on a second side of the ring; and
      a first half of the second antenna is connected to a third node between two Josephson junctions on a third side of the ring and a second half of the second antenna is connected to a fourth node between two Josephson junctions on a fourth side of the ring.

2. The wireless converter of claim 1, wherein the converter is configured to receive pump energy at a first frequency, the first antenna is sized to couple to electromagnetic energy at a second frequency, and the second antenna is sized to couple to electromagnetic energy at a third frequency different from the second frequency, and wherein the first frequency is essentially equal to a sum of the second and third frequencies or a difference of the second and third frequencies.

3. The wireless converter of claim 1, wherein the plurality of first Josephson junctions is arranged to form a Josephson parametric converter.

4. The wireless converter of claim 3, wherein the converter is capable of providing 20 dB gain over a tunable frequency range as wide as approximately 400 MHz.

5. The wireless converter of claim 3, wherein the converter is capable of providing a gain of approximately 25 dB with approximately 1 dB compression occurring at a value of between approximately—140 dBm and approximately—120 dBm.

6. The wireless converter of claim 1, further comprising:
   a first capacitor connected to a first node between a first half of the first antenna and the ring;
   a second capacitor connected to a second node between a second half of the first antenna and the ring;
   a third capacitor connected to a third node between a first half of the second antenna and the ring; and
   a fourth capacitor connected to a fourth node between a second half of the second antenna and the ring.

7. The wireless converter of claim 6, wherein the first through fourth capacitors comprise parallel plate capacitors formed on the substrate.

8. The wireless converter of claim 6, wherein the first through fourth capacitors comprise interdigitated capacitors formed on the substrate.

9. The wireless converter of claim 6, wherein the first and second capacitors have essentially a same first capacitance and the third and fourth capacitors have essentially a same second capacitance that is different from the first capacitance.

10. The wireless converter of claim 6, wherein the first through fourth capacitors are formed, at least in part, from a same layer of material used to form the plurality of first Josephson junctions.

11. The wireless converter of claim 10, wherein the same layer of material forms the first antenna and the second antenna.

12. The wireless converter of claim 10, wherein the same layer of material supports superconductivity.

13. The wireless converter of claim 6, wherein the ground plane forms reference potential plates for the first through fourth capacitors.

14. The wireless converter of claim 1, wherein the ground plane comprises a conductive film patterned in an annular shape having at least one cut across the film, wherein the cut prevents circular current flow around the annularly shaped film.

15. The wireless converter of claim 14, wherein the at least one cut divides the ground plane symmetrically with respect to the first antenna and/or second antenna.

16. The wireless converter of claim 1, further comprising a second plurality of Josephson junctions located within the first plurality of Josephson junctions and connected to the first plurality of Josephson junctions.

17. The wireless converter of claim 16, wherein junction sizes of the second plurality of Josephson junctions are larger than junction sizes of the first plurality of Josephson junctions.

18. The wireless converter of claim 16, further comprising a conductive coil located adjacent to the ring and configured to provide magnetic flux through the ring when an electrical current is applied to the coil.

19. The wireless converter of claim 1, further comprising:
   a first waveguide abutting a first side of the substrate and having a first long transverse axis;
   a first port in the first waveguide for coupling first energy to and from the first waveguide;
   a second waveguide abutting a second side of the substrate opposite the first side and having a second long transverse axis that is essentially orthogonal to the first long transverse axis; and
   a second port in the second waveguide for coupling second energy to and from the second waveguide.

20. The wireless converter of claim 19, further comprising at least a third port for coupling pump energy to the plurality of first Josephson junctions.

21. The wireless converter of claim 1 incorporated in a quantum information processing system.

22. A method of operating a wireless converter, the method comprising:
   wirelessly receiving pump energy at a first frequency by a first plurality of Josephson junctions formed on a substrate and connected in a ring;
   wirelessly receiving a signal at a second frequency from a first antenna formed on the substrate, wherein a first half of the first antenna is connected to a first node between two Josephson junctions on a first side of the ring and a second half of the first antenna is connected to a second node between two Josephson junctions on a second side of the ring;
   wirelessly receiving an idler at a third frequency from a second antenna formed on the substrate, wherein a first half of the second antenna is connected to a third node between two Josephson junctions on a third side of the ring and a second half of the second antenna is connected to a fourth node between two Josephson junctions on a fourth side of the ring;
   converting pump energy to the second frequency and third frequency by the plurality of Josephson junctions; and
   wirelessly emitting an altered signal with the first antenna.

23. The method of claim 22, wherein the converting frequency converts input received at the second frequency to output at the third frequency.

24. The method of claim 22, wherein the converting amplifies input received at the second frequency to an amplified output at the second frequency.

25. The method of claim 22, further comprising:
   receiving a change in magnetic flux through the ring; and
   converting pump energy to a fourth frequency different from the second frequency responsive to the change in received magnetic flux.

26. The method of claim 25, further comprising applying a current to a conductive coil to control an amount of the magnetic flux.

27. The method of claim 22, wherein the signal is received from a first qubit and the idler is received from a second qubit and further comprising measuring at least an output signal from the first antenna.

28. The method of claim 27, wherein the measuring entangles the first qubit and second qubit.

* * * * *

UNITED STATES PATENT AND TRADEMARK OFFICE
CERTIFICATE OF CORRECTION

PATENT NO. : 10,693,566 B2
APPLICATION NO. : 15/567198
DATED : June 23, 2020
INVENTOR(S) : Katrina Sliwa et al.

Page 1 of 1

It is certified that error appears in the above-identified patent and that said Letters Patent is hereby corrected as shown below:

On the Title Page

In item (57) Abstract, Line 3, delete the word "pump".

Signed and Sealed this
Twenty-fifth Day of August, 2020

Andrei Iancu
*Director of the United States Patent and Trademark Office*